(12) United States Patent
Sato et al.

(10) Patent No.: US 12,454,032 B2
(45) Date of Patent: Oct. 28, 2025

(54) SUBSTRATE PROCESSING APPARATUS

(71) Applicant: TDK CORPORATION, Tokyo (JP)

(72) Inventors: Yohei Sato, Tokyo (JP); Hiroshi Koizumi, Tokyo (JP); Osamu Shindo, Tokyo (JP); Mitsuyoshi Makida, Tokyo (JP); Masashi Matsumoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 299 days.

(21) Appl. No.: 18/323,820

(22) Filed: May 25, 2023

(65) Prior Publication Data

US 2023/0381903 A1    Nov. 30, 2023

(30) Foreign Application Priority Data

May 26, 2022   (JP) ................................ 2022-086037

(51) Int. Cl.
   B23Q 1/03        (2006.01)

(52) U.S. Cl.
   CPC .................. *B23Q 1/032* (2013.01)

(58) Field of Classification Search
   CPC ............. B23Q 1/032; H01L 21/67369; H01L 21/68778; H01L 21/67092; H01L 21/67248; H01L 21/68785; H01L 21/603; H01L 21/52; H01L 21/67103
   See application file for complete search history.

(56) References Cited

U.S. PATENT DOCUMENTS

2012/0247664 A1* 10/2012 Kobayashi ............ H01L 24/75
                                                        156/308.2

FOREIGN PATENT DOCUMENTS

JP         2010-232234 A      10/2010

* cited by examiner

*Primary Examiner* — Jason L Vaughan
*Assistant Examiner* — Amanda Kreiling
(74) *Attorney, Agent, or Firm* — Oliff PLC

(57) ABSTRACT

A substrate processing apparatus including a lower jig plate for arranging a substrate which is an object to be pressurized, columnar members supporting the lower jig plate, and a heat dissipating column contacting the lower jig plate directly or indirectly and having a higher heat dissipation property than the columnar members.

5 Claims, 12 Drawing Sheets

SUBSTRATE PROCESSING APPARATUS

BACKGROUND OF THE INVENTION

The present disclosure relates to a substrate processing apparatus for processing a substrate, for example, on which a plurality of elements is arranged.

In a technology of forming an element array including a plurality of elements on a substrate, to improve mechanical bonding strength and bonding stability between the plurality of elements and the substrate, a substrate processing apparatus is used to press the plurality of elements using a flat plate against the substrate on which the plurality of elements is arranged (Patent Document 1).

As a substrate processing apparatus that executes this type of processing, for example, a substrate processing apparatus which includes a lower jig plate on which an object to be pressurized (a substrate on which a plurality of elements is arranged) is arranged, and an upper jig plate that pressurizes the object arranged on the lower jig plate is used. When the substrate on which the plurality of elements is arranged is pressed using the upper jig plate while on the lower jig plate, load is applied to the substrate, and accordingly, the plurality of elements can be pressed against the substrate.

In recent years, a size (height) of an element arranged on a substrate has become as small as about several µm. When parallelism, flatness, and the like of a surface of the lower jig plate or the upper jig plate vary by about several tens µm, it becomes difficult to apply a uniform load using the upper jig plate to the plurality of elements on the substrate, and a bonding failure may occur between the plurality of elements and the substrate.

Also, when the substrate is pressed using the upper jig plate, the lower jig plate and the like may thermally deform due to heating of the upper jig plate or the lower jig plate, and it becomes difficult to apply a uniform load to the substrate. Therefore, when no load is applied, even if parallelism, flatness, and the like of the surfaces of the upper jig plate and the lower jig plate can be secured to some extent, bonding failure may occur between the plurality of elements and the substrate due to thermal deformation of the lower jig plate when pressure is applied to the substrate.

[Patent Document 1] Japanese Patent Application Laid-Open No. 2010-232234

BRIEF SUMMARY OF INVENTION

The present disclosure has been made in view of such circumstances, and an object of the present disclosure is to provide a substrate processing apparatus capable of applying uniform load to an object to be pressurized.

In order to achieve the above object, a substrate processing apparatus according to the present disclosure includes a lower jig plate for arranging an object to be pressurized,
columnar members supporting the lower jig plate, and
a heat dissipating column contacting the lower jig plate directly or indirectly and having a higher heat dissipation property than the columnar members.

The substrate processing apparatus according to the present disclosure includes the columnar members supporting the lower jig plate. By applying pressure to the object to be pressurized which is arranged to the lower jig plate while the lower jig plate is being supported by the columnar members, the in-plane distribution of bending generated to the lower jig plate can be adjusted in accordance with the shapes, materials, arrangements, and so on of the columnar members, thus the in-plane distribution of load applied to the object can be adjusted to be uniform.

Also, the substrate processing apparatus according to the present disclosure includes the heat dissipating column contacting the lower jig plate directly or indirectly, and having a heat dissipation property higher than the columnar members. When the lower jig plate is heated, at the position where the columnar members are arranged, heat of the lower jig plate is released through the columnar members. However, for example, at the position where the columnar members are not arranged, by bringing the heat dissipating column into contact with the lower jig plate directly or indirectly, heat of the lower jig plate can be released through the heat dissipating column without influencing the support force provided to the lower jig plate from the columnar members. Thereby, it is less likely to form temperature difference in the lower jig plate between the position where the columnar members are arranged and the position where the columnar positions are not arranged. Hence, it is less likely that a surface accuracy (for example, flatness, smoothness, and so on) differs depending on the positions of the lower jig plate which could be caused by the thermal deformation of the lower jig plate. Therefore, uniform load can be applied to the object arranged on the lower jig plate.

Preferably, the heat dissipating column may include heat dissipating columns, and the heat dissipating columns may be arranged in accordance with the in-plane distribution of the temperature of the lower jig plate. For example, at the position where the columnar members are densely arranged, or at the position where a columnar member with large cross-sectional area is arranged, heat dissipation is facilitated through these columnar members, thus the temperature of the lower jig plate tends to be relatively low. Therefore, by arranging the heat dissipating column at the position where such columnar members are not arranged, that is, at the position where the temperature of the lower jig plate is relatively high, temperature difference between different positions on the lower jig plate can be prevented.

Preferably, the heat dissipating column may include a column main body, and a cover portion covering the column main body and including a material with a higher thermal conductivity than the column main body. By bringing the cover portion into contact with the lower jig plate, heat of the lower jig plate can be efficiently released to outside through the heat dissipating column.

Preferably, the cover portion may be attached at a top of the column main body, and a resilient member may be provided between the cover portion and the top of the column main body. By configuring as such, the cover portion is provided with a cushion property due to the resilient member. Thus, when the lower jig plate is bent while the lower jig plate is supported by the columnar members, the resilient member resiliently deforms, and also the height position of the cover portion changes in accordance with the resilient deformation of the resilient member. Thereby, the in-plane distribution of load generated to the lower jig plate can be adjusted using the columnar members, and heat dissipation of the lower jig plate can be facilitated through the heat dissipating column.

Preferably, the heat dissipating column may be provided at a position where a relatively large load is applied to the lower jig plate. For example, if the supporting member with relatively small cross-sectional area is arranged in order to reduce load at the position where load applied to the lower jig plate becomes relatively large, the heat dissipation amount becomes small compared to the position where load applied to the lower jig plate becomes relatively large, thus temperature difference is generated in the lower jig plate. Therefore, by providing the heat dissipating column at the position where load applied to the lower jig plate becomes relatively large, heat dissipation through the heat dissipating column is facilitated, and this can effectively prevent the temperature difference from occurring in the lower jig plate.

Preferably, the substrate processing apparatus further includes an installation portion where the columnar members and the heat dissipating column are installed. By configuring as such, the positions of the columnar members can be determined easily, the position shifting of the columnar members can be prevented, and the columnar members can stably support the lower jig plate. Also, the heat dissipating column can be stably in contact with the lower jig plate.

DETAILED DESCRIPTION OF INVENTION

Hereinafter, the present disclosure is described based on embodiments shown in the figures.

Figure 1A:
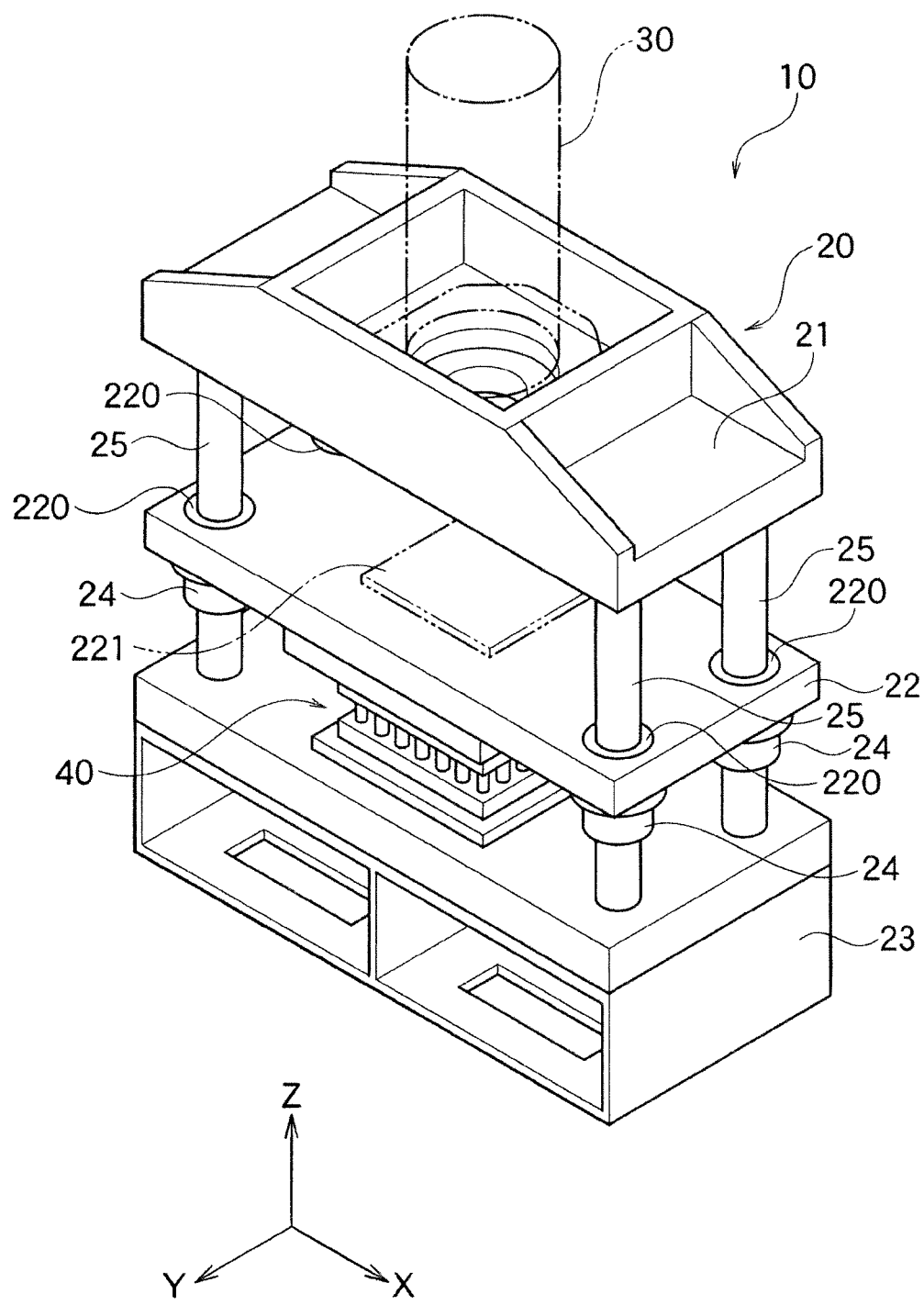
FIG. 1A is a perspective view of a substrate processing apparatus according to an embodiment of the present disclosure.

As shown in FIG. 1A, a substrate processing apparatus 10 according to an embodiment of the present disclosure is an apparatus for forming an element array 4 (FIG. 2) including elements 4a, 4b, and 4c on a substrate 2, and presses the elements 4a, 4b, and 4c against the substrate 2 using a predetermined means on which the elements 4a, 4b, and 4c are arranged. Thereby, mechanical bonding strength and bonding stability between the substrate 2 and the elements 4a, 4b, and 4c can be enhanced. That is, the substrate processing apparatus 10 functions as a pressurizing portion (pressurizing device) when the element array 4 is formed on the substrate 2.

As a material of the substrate 2, for example, a glass epoxy material may be mentioned. Note that, the material of the substrate 2 is not limited thereto, and for example, the substrate 2 may be made of $SiO_2$ or $Al_2O_3$ as a glass substrate; or it may be a flexible substrate made of elastomers such as polyimide, polyamide, polypropylene, polyetheretherketone, urethane, silicone, polyethylene terephthalate, polyethylene naphthalate, or so; furthermore, the substrate 2 may be a glass wool.

For example, a conductive bonding material, which is not shown in the figures, may be formed on the surface of the substrate 2 in advance. Due to anisotropic conductive particle connection, bump compression connection, or the like, this conductive bonding material electrically and mechanically connects the substrate 2 and the elements 4a, 4b, and 4c, and the conductive bonding material is cured by heating. As examples of the conductive bonding material, ACF, ACP, NCF, NCP, and the like may be mentioned. A thickness of the conductive bonding material may preferably be within a range of 1.0 to 10000 μm.

Circuit patterns are formed in a predetermined pattern on the substrate 2, and electrodes of the elements 4a, 4b, and 4c can be connected to the circuit patterns via the conductive bonding material.

The elements 4a, 4b, and 4c are arranged on the substrate 2 in an array form. An array form means that the elements 4a, 4b, and 4c are arranged in rows and columns according to a predetermined pattern, and spaces in the row direction and the column direction may be the same or different.

The elements 4a, 4b, and 4c are arranged as RGB pixels on a substrate for a display, and are arranged on a light emitting substrate as a backlight emitter. The element 4a is a red light emitting element, the element 4b is a green light emitting element, and the element 4c is a blue light emitting element. Note that, the elements arranged on the substrate 2 are not limited to these elements.

The elements 4a, 4b, and 4c of the present embodiment are micro light emitting elements (micro LED elements), and the size (width×length) thereof may, for example, be within a range of 5 μm×5 μm to 50 μm×50 μm. The thicknesses (heights) of the elements 4a to 4c may for example be 50 μm or less.

The substrate processing apparatus 10 includes a pedestal 20, a load generating portion 30, and a substrate pressurizing portion 40. In the figures, X axis corresponds to a width direction of the pedestal 20, Y axis corresponds to a depth direction of the pedestal 20, and Z axis corresponds to a height direction of the pedestal 20.

The pedestal 20 may be formed of, for example, a case made of metals and the like, and the pedestal 20 includes a pedestal upper portion 21, a movable pressurizing portion 22, a pedestal lower portion 23, a guide bush 24, and a guide shaft 25. The pedestal lower portion 23 constitutes a base portion (table) of the pedestal 20 and has a predetermined height. In the example shown in the figures, a hollow portion is formed at inside of the pedestal lower portion 23. However, the shape of the pedestal lower portion 23 is not limited thereto, and inside of the pedestal lower portion 23 may be solid.

Lower ends of the four guide shafts 25 are fixed (inserted) to the four corners of the pedestal lower portion 23. These guide shafts 25 each have a predetermined length and is arranged so that it is standing upright in the Z-axis direction. A lower end of each guide shaft 25 is fixed to the pedestal lower portion 23, and an upper end of each guide shaft 25 is fixed to the pedestal upper portion 21. The guide shaft 25 penetrates the four corners of the movable pressurizing portion 22 arranged between the pedestal upper portion 21 and the pedestal lower portion 23. These guide shafts 25 function to support the pedestal upper portion 21 and also function to support the movable pressurizing portion 22 so that it can slide up and down in the Z-axis direction.

Figure 1B:
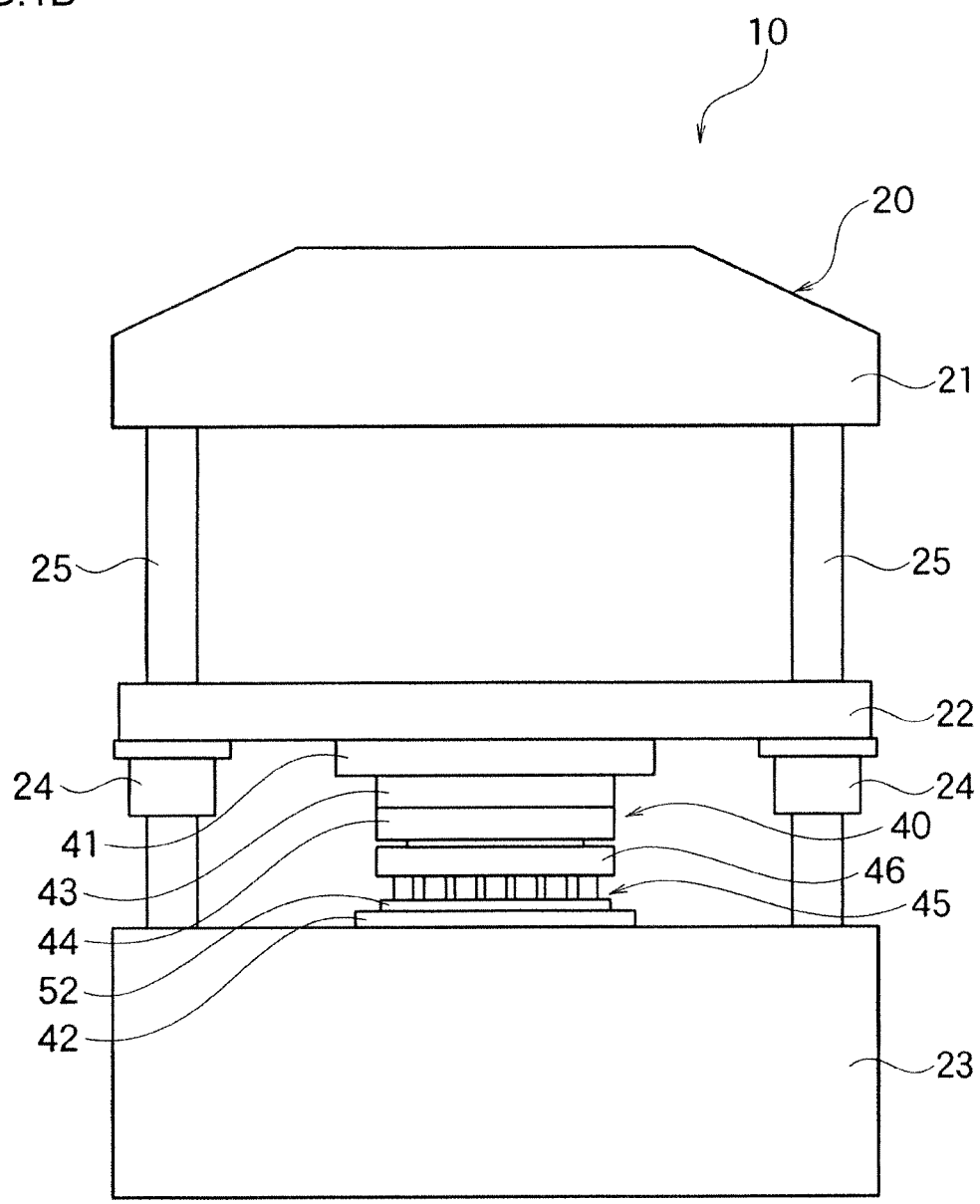
FIG. 1B is a side view of the substrate processing apparatus shown in FIG. 1A.
Figure 1B:
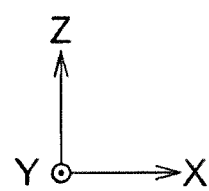

The movable pressurizing portion 22 is a plate-shaped body (rigid body) having a rectangular shape, and is positioned between the pedestal lower portion 23 and the pedestal upper portion 21. The movable pressurizing portion 22 is configured so that it can slide in a vertical direction along the four guide shafts 25 by receiving load from the load generating portion 30. As shown in FIG. 1B, the movable pressurizing portion 22 contacts with an upper face of the substrate pressurizing portion 40 and applies pressure thereto, thereby for example, load of about 0 to 100 kN is applied to the substrate pressurizing portion 40. Preferably, the movable pressurizing portion 22 may be parallel to the substrate pressurizing portion 40 and is in contact with the substrate pressurizing portion, and parallelism A of the movable pressurizing portion 22 against the substrate pressurizing portion 40 may preferably be within a range of 1 µm≤A<2 µm.

As shown in FIG. 1A, four through holes 220 are respectively formed at four corners of the movable pressurizing portion 22, and four guide shafts 25 are respectively inserted into the through holes 220. Four guide bushes 24 are fixed to the lower face (the face on the Z-axis negative direction side) of the movable pressurizing portion 22 at positions matching the four through holes 220. When the movable pressurizing portion 22 is moving in the vertical direction, the guide bush 24 functions to improve sliding of the movable pressurizing portion 22 (reduces friction against the guide shaft 25) and also functions to easily determine the position of the guide shaft 25 against the axis of the through hole 220.

The pedestal upper portion 21 configures a ceiling portion of the pedestal 20. The upper ends of the four guide shafts 25 are fixed (inserted) to the four corners of the lower face of the pedestal upper portion 21. A load generating portion 30 is fixed to a center area of the pedestal upper portion 21. The load generating portion 30 is constituted by a device such as a pressurizing cylinder, a servo press, a motor, an actuator, or so, and functions to apply load to the movable pressurizing portion 22. Note that, in order to prevent the figures from becoming too complicated, the detailed configuration of the movable pressurizing portion 22 is not shown, and only part of the configuration is shown.

The load generating portion 30 applies load to the movable pressurizing portion 22 by applying pressure to a center area 221 of the movable pressurizing portion 22 using a press head (not shown in the figures). Thereby, the movable pressurizing portion 22 moves downward and applies pressure to the substrate pressurizing portion 40. As a result, the substrate pressurizing portion 40 can apply load to the object (the substrate 2 on which the elements 4a, 4b, 4c are arranged).

Figure 3A:
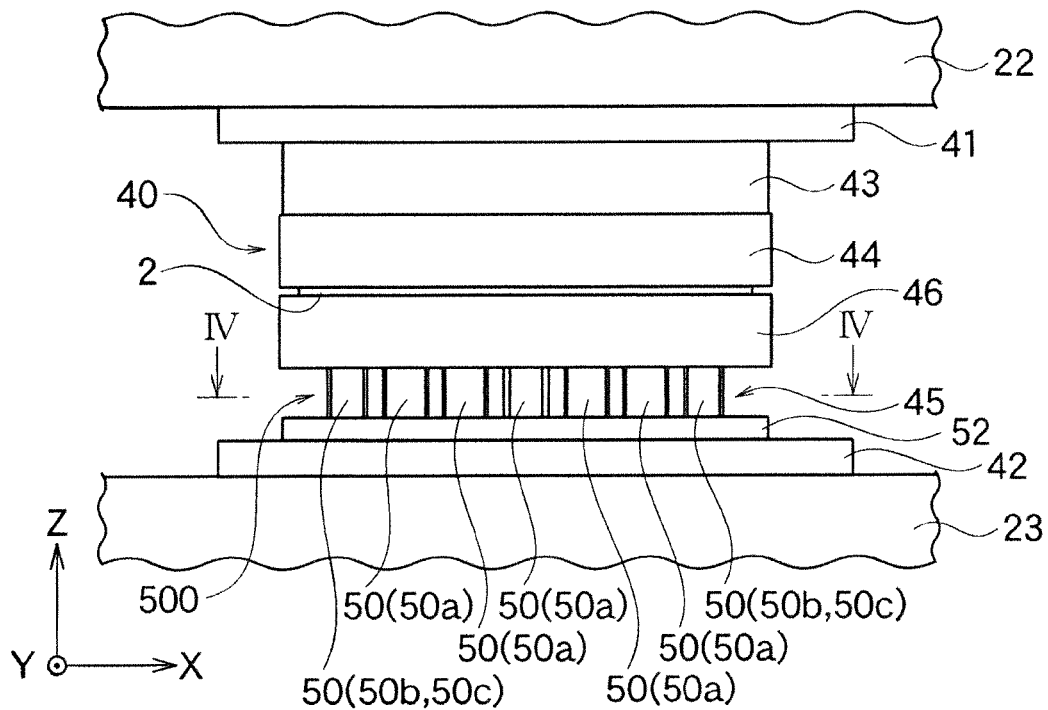
FIG. 3A is an enlarged side view of a substrate pressing portion of the substrate processing apparatus shown in FIG. 1A.

As shown in FIG. 3A, the substrate pressurizing portion 40 includes an upper stage 41, a lower stage 42, an upper mounting portion 43, an upper jig plate 44, a support member 45, and a lower jig plate 46. The upper stage 41 is provided on the lower face of the movable pressurizing portion 22, and the lower stage 42 is provided on the upper face of the pedestal lower portion 23. A thickness of each of the upper stage 41 and the lower stage 42 is thicker than the thickness of the substrate 2. The upper stage 41 and the lower stage 42 have the same shapes, and a width of each of these in the X-axis direction is wider than widths of the upper mounting portion 43 and the support member 45 in the X-axis direction. Note that, the shapes of the upper stage 41 and the lower stage 42 are not limited to the shapes shown in the figures, and may be changed appropriately.

Preferably, the upper stage 41 may be formed of a flat plate-shaped body (rigid body) having a relatively high surface accuracy (for example, flatness, smoothness, or the like). For example, preferably a surface accuracy of the upper face of the upper stage 41 may be better than a surface accuracy of the lower face of the movable pressurizing portion 22; that is, in the upper face of the upper stage 41, preferably unevenness may be less (i.e., smoother) and less angled against the horizontal plane (i.e., flatter) than the lower surface of the movable pressurizing portion 22.

As such, by fixing the upper stage 41 having excellent surface accuracy to the lower face of the movable pressurizing portion 22, when the upper mounting portion 43 is fixed to the lower face of the upper stage 41, the upper mounting portion 43 or the upper jig plate 44 mounted thereon can be stably arranged without being angled against the horizontal plane.

Preferably, the lower stage 42 may be a flat plate-shaped body (rigid body) and is preferably formed of a member having relatively high surface accuracy (for example, flatness, smoothness, or the like). For example, preferably the surface accuracy of the upper face of the lower stage 42 may be better than the surface accuracy of the upper face of the pedestal lower portion 23; that is, in the upper face of the lower stage 42, preferably unevenness may be less (i.e., smoother) and less angled against the horizontal plane (i.e., flatter) than the upper surface of the pedestal lower portion 23.

As such, by fixing the lower stage 42 having excellent surface accuracy to the upper face of the pedestal lower portion 23, when the support member 45 is fixed to the upper face of the lower stage 42, the support member 45 or the lower jig plate 46 supported by the support member 45 can be stably arranged without being angled against the horizontal plane.

The upper mounting portion 43 has an appearance of a flat plate-like shape and is fixed to the lower face of the upper stage 41. The upper jig plate 44 is mounted on the upper mounting portion 43. The upper mounting portion 43 functions to support the upper jig plate 44.

The upper jig plate 44 is a flat plate-shaped body (rigid body) and is fixed (mounted) to the lower face of the upper mounting portion 43. The upper jig plate 44 functions to apply pressure on the substrate 2 arranged on the lower jig plate 46. A heating function (for example, a heater) is built in the upper jig plate 44, and when the substrate 2 is pressed by the upper jig plate 44, the substrate 2 can be heated by the upper jig plate 44. For example, when the conductive bonding material is used for connecting the elements 4a, 4b, and 4c with the substrate 2, the elements 4a, 4b, and 4c can be firmly connected to the substrate 2 by heating the substrate 2, and bonding force between the substrate 2 and the elements 4a, 4b, and 4c arranged thereon can be enhanced.

Preferably, the upper jig plate 44 may be formed of a member having relatively high surface accuracy. Preferably, the surface accuracy of the lower face of the upper jig plate 44 may be, for example, better than the surface accuracy of the lower face of the upper stage 41; that is, in the lower surface of the upper jig plate 44, preferably unevenness may be less (i.e., smoother) and less angled against the horizontal plane (i.e., flatter) than the lower surface of the upper stage 41. A surface roughness Ra of the surface (particularly, the lower face) of the upper jig plate 44 may particularly preferably be Ra≤1 μm.

As such, by improving the surface accuracy of the upper jig plate 44, when the substrate 2 arranged on the lower jig plate 46 is pressed by the lower face of the upper jig plate 44, unevenness of the load applied to the substrate 2 can be reduced, and a uniform load can be applied to the elements 4a, 4b, and 4c arranged on the substrate 2.

The lower jig plate 46 is a flat plate-shaped body (rigid body) and it is supported by the support member 45. The lower jig plate 46 and the upper jig plate 44 are about the same shapes, and the lower jig plate 46 and the upper jig plate 44 face against each other. The substrate 2, which is an object to be pressed, can be arranged on the lower jig plate 46. As similar to the upper jig plate 44, a heating function (for example, a heater) is built in the lower jig plate 46, and when the substrate 2 is pressed by the upper jig plate 44, the substrate 2 can be heated by the lower jig plate 46 (and the upper jig plate 44).

Preferably, the lower jig plate 46 may be formed of a member having relatively high surface accuracy. Preferably, the surface accuracy of the upper face of the lower jig plate 46 may be better than the surface accuracy of the upper face of the lower stage 42; that is, in the upper surface of the lower jig plate 46, preferably unevenness may be less (i.e., smoother) and less angled against the horizontal plane (i.e., flatter) than the upper surface of the lower stage 42.

A surface roughness Ra of the surface (particularly, the upper face) of the lower jig plate 46 may particularly preferably be Ra≤1 μm, as similar to the surface roughness Ra of the surface of the upper jig plate 44. Also, parallelism A between the lower jig plate 46 and the upper jig plate 44 may preferably be A≤1 μm.

As such, by improving the surface accuracy of the lower jig plate 46, when the substrate 2 arranged on the lower jig plate 46 is pressed by the lower face of the upper jig plate 44, the lower face of the upper jig plate 44 and the substrate 2 become parallel to each other (contact with each other), and the above-mentioned effect of enhancing uniform distribution of load applied to the substrate 2 can be obtained.

Even if a certain level of surface accuracy of the upper jig plate 44 and the lower jig plate 46 is secured, when the substrate 2 is pressurized using the upper jig plate 44, the lower jig plate 46 is bent to some extent, and the lower jig plate 46 and the upper jig plate 44 may not have sufficient contact property (adhesive property). Thus, it may become difficult to apply uniform load to the substrate 2 (or to the elements 4a, 4b, and 4c arranged on the substrate 2), and the bonding condition between the substrate 2 and the elements 4a, 4b, and 4c may vary.

That is, in relativity, the substrate 2 has an area where the load changes in decreasing direction when a small surface pressure is applied, and an area where the load changes in increasing direction when a large surface pressure is applied, hence the load distribution of the substrate 2 becomes non-uniform. Therefore, in the substrate processing apparatus 10 according to the present embodiment, the support member 45 is provided with a means for solving the non-uniform load distribution when pressure is applied to the substrate 2. Hereinafter, the support member 45 will be described in detail.

The support member 45 is fixed to the upper face of the lower stage 42 and supports the lower jig plate 46. That is, in the present embodiment, the lower jig plate 46 is provided above the lower stage 42 by having the support member 45 in between. The support member 45 is configured so that it can adjust the amount of load applied on the substrate 2 which is caused by bending of the above-mentioned lower jig plate 46; and the support member 45 provides a support force to the lower jig plate 46 in accordance with the in-plane distribution of the load applied to the lower jig plate 46.

For example, in the lower jig plate 46, the closer a position is to a center of the lower jig plate 46, the more the lower jig plate 46 is bent in a concave shape and protrudes downward, and the surface pressure applied to the position becomes relatively small. Thus, the load applied to the lower jig plate 46 may become relatively small in some cases. As such, at the position where the load applied to the lower jig plate 46 is relatively small, the support member 45 provides a relatively large supporting force to the lower jig plate 46. Thereby, at a position close to the center area of the lower jig plate 46, the lower jig plate 46 bends less, and the load applied to the lower jig plate 46 can be increased. As a result, the load applied to the substrate 2 arranged on the lower jig plate 46 at this position can be increased.

Also, as a position of the lower jig plate 46 is farther away from the center area thereof, the surface pressure applied to the position becomes relatively large, and the applied load may become relatively large. As such, at a position where load applied to the lower jig plate 46 becomes relatively large, the support member 45 provides a small supporting force to the lower jig plate 46. Thereby, at a position farther away from the center area of the lower jig plate 46, the lower jig plate 46 bends easily, and load applied to the lower jig plate 46 can be reduced. As a result, load applied to the substrate 2 arranged on the lower jig plate 46 at the position can be reduced.

As such, the support member 45 adjusts bending of the lower jig plate 46 so that load applied to each position of the lower jig plate 46 are balanced out, and uniform load can be applied to the substrate 2. Hereinafter, a specific means for providing the lower jig plate 46 with a supporting force in accordance with the in-plane distribution of load of the lower jig plate 46 using the support member 45 will be described.

The support member 45 includes a collective body 500 of columnar members 50 and an installation portion 52 where the columnar members 50 and the heat dissipation column 53 (FIG. 8) are placed. The columnar members 50 each has a columnar shape and functions to support the lower jig plate 46. The shape of columnar member 50 is not limited thereto, and it may be a triangular prism shape, a square prism shape, any another polygonal prism shape, a cone shape, a triangular pyramid shape, or any another polygonal pyramid shape. The columnar member 50 may be a hollow shape.

Figure 4:
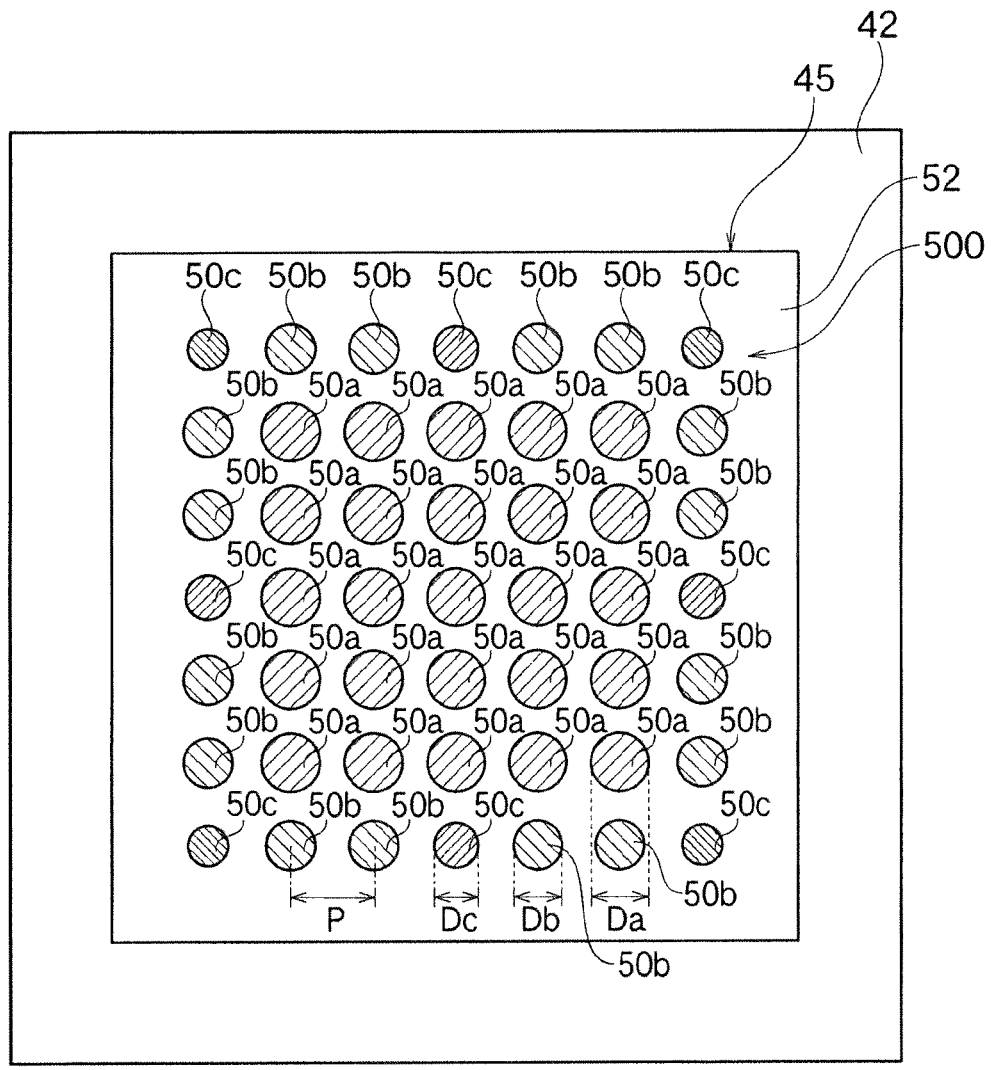
FIG. 4 is a cross sectional view of the substrate pressing portion shown in FIG. 3A along a line Iv-Iv.

Preferably, the columnar members 50 may be formed of a resiliently deformable solid body. As shown in FIG. 4, for example, the columnar members 50 are orderly arranged in a matrix form of 7 rows and 7 columns on the installation portion 52, and the columnar members 50 are arranged by taking predetermined space between each other in the X-axis direction and the Y-axis direction. In the example shown in the figures, the center distances between each of the columnar members 50 are substantially the same, and the columnar members 50 are arranged at equal space between each other, but the space between the columnar members 50 do not necessarily have to be the same. Also, when viewed from above, the columnar members 50 are evenly arranged from one end to the other end throughout X-axis direction and Y-axis direction of the installation portion 52, but the columnar members 50 may be unevenly distributed (concentrated) in part of the installation portion 52.

Also, the columnar members 50 may be arranged randomly on the installation portion 52 or may be arranged concentrically. The arrangement of the columnar members 50 is appropriately determined according to the in-plane distribution of load applied to the lower jig plate 46. Note that, at the installation part 52, the heat dissipation column 53, which is described in below, is installed in addition to the columnar members 50, however, it is not shown in FIG. 4 to avoid the figure becoming too complicated.

In the present embodiment, the columnar members 50 do not necessarily all have the same cross-sectional areas (cross sectional areas parallel to the XY plane), and the columnar members 50 include a columnar member 50 having a relatively large cross-sectional area (a columnar member 50a), a columnar member 50 having a relatively small cross-sectional area (a columnar member 50c), and a columnar member 50 having a cross sectional area which is between these two (a columnar member 50b). That is, the columnar members 50 are formed of a plurality of members having different shapes.

The columnar members 50a are arranged at positions where load applied to the lower jig plate 46 is relatively small, and the columnar members 50b and 50c are arranged at positions where load applied to the lower jig plate 46 is relatively large. That is, the columnar members 50a, 50b, and 50c are arranged in accordance with the in-plane distribution of load applied to the lower jig plate 46.

In the example shown in the figures, the columnar members 50a are arranged on the installation portion 52 in a matrix form of 5 rows and 5 columns. In below, the columnar member 50a positioned at the center of the collective body of columnar members 50a may be specifically referred to as a columnar member 50a1. The columnar member 50a1 is arranged roughly at the center of the lower jig plate 46 (directly below the pressurizing shaft of the load generating portion 30). Note that, the pressurizing shaft may be configured of a single shaft or a plurality of shafts.

The columnar members 50b and the columnar members 50c are arranged at the outside of the collective body of columnar members 50a (the outermost periphery of the collective body 500) and surround the collective body of columnar members 50a. At the outermost periphery of the collective body 500, four columnar members 50c are arranged at four corners, and four more columnar members 50c are arranged between said four columnar members 50c. Further, two columnar members 50b are arranged in pairs between the columnar members 50c. The arrangement of the columnar members 50a, 50b, and 50c shown in FIG. 4 is an example, and the arrangement thereof may be appropriately changed.

When a width (diameter) of the columnar member 50a is Da, a width (diameter) of the columnar member 50b is Db, and a width (diameter) of the columnar member 50c is Dc, then Da>Db>Dc is satisfied. The diameters Da, Db, and Dc are preferably within a range of 10 to 20 mm. Also, a ratio Da/Dc is preferably within a range of 2/1 to 1.5/1 which is a ratio between the diameter Da of the columnar member 50a having the largest diameter to the diameter Dc of the columnar member 50c having the smallest diameter. By setting the diameter (thickness) of each of the columnar members 50a, 50b, and 50c within such range, each of the columnar members 50a, 50b, and 50c can bend appropriately in accordance with the magnitude or in-plane distribution of load applied to the lower jig plate 46.

Note that, among the columnar members 50a, a diameter of the columnar member may be larger than the diameter of other columnar members 50a so that the columnar member 50a1 becomes harder to bend compared to other columnar members 50a.

A center distance (pitch) P between the columnar members 50 may preferably be within a range of 20 to 50 mm, and more preferably within a range of 20 to 25 mm. By setting the center distance P between the columnar members 50 within such range, the columnar members 50a, 50b, and 50c can evenly support the entire lower jig plate 46, and the lower jig plate 46 can be supported with an appropriate supporting force. In the present embodiment, at the positions where the columnar members 50a, 50b, and 50c are arranged, a supporting force can be locally provided to the lower jig plate 46 by the columnar members 50a, 50b, and 50c.

A length L of the columnar members 50 may preferably be within a range of 20 to mm, and more preferably within a range of 20 to 25 mm. The length L of the columnar members 50 may be substantially the same as the height of the lower jig plate 46.

When a cross sectional area of the columnar member 50a is Sa, a cross sectional area of the columnar member 50b is Sb, and a cross sectional area of the columnar member is Sc, then Sa>Sb>Sc is satisfied. The cross-sectional area Sa of the columnar member 50a arranged at a position where load applied to the lower jig plate 46 is relatively small is larger than the cross-sectional areas Sb and Sc of the columnar members 50b and arranged at positions where load applied to the lower jig plate 46 is relatively large.

In the case that the lower jig plate 46 is supported by the columnar members 50a, 50b, and 50c, and load is applied to the lower jig plate 46 (FIG. 3A) by applying pressure to the substrate 2 using the upper jig plate 44 (FIG. 3A), and also load is applied to the columnar members 50a, 50b, and 50c; a relatively small amount of strain (compression strain in the Z-axis negative direction) is generated to in the columnar member 50a. At the same time, relatively large amount of strain (compression strain in the Z-axis negative direction) is generated to the columnar members 50b and 50c. As such, in the present embodiment, when load is applied to the columnar members 50a, 50b, and 50c, strain is generated to the columnar members 50a, 50b, and 50c by an amount of strain in accordance with these cross-sectional area Sa, Sb, and Sc.

The columnar members 50a, 50b, and 50c can freely expand and contract along an extending direction thereof by deforming in accordance with the cross-sectional area thereof when load is applied. The moment at which the columnar members 50a, 50b, and 50c deform by receiving load is roughly the same as the moment at which the lower jig plate 46 receives load from the upper jig plate 44, the moment at which the upper jig plate 44 receives load from the movable pressurizing portion 22, or the moment at which the movable pressurizing portion 22 receives load from the load generating portion 30. When no load is applied to the columnar members 50a, 50b, and 50c, the columnar members 50a, 50b, and 50c are not deformed and these are at the original state.

In the present embodiment, the amount of strain of the columnar member 50a arranged at a position where a relatively small load is applied to the lower jig plate 46 is smaller than the amounts of strain of the columnar members 50b and 50c arranged at positions where a relatively large load is applied to the lower jig plate 46. That is, in the columnar members 50, a strain gradient is formed in accordance with the in-plane distribution of load applied to the lower jig plate 46; and the closer the columnar member 50 is arranged to the center of the lower jig plate 46, the smaller the strain is; and the closer the columnar member 50 is arranged to the outer periphery of the lower jig plate 46, the larger the strain is.

Figure 3B:
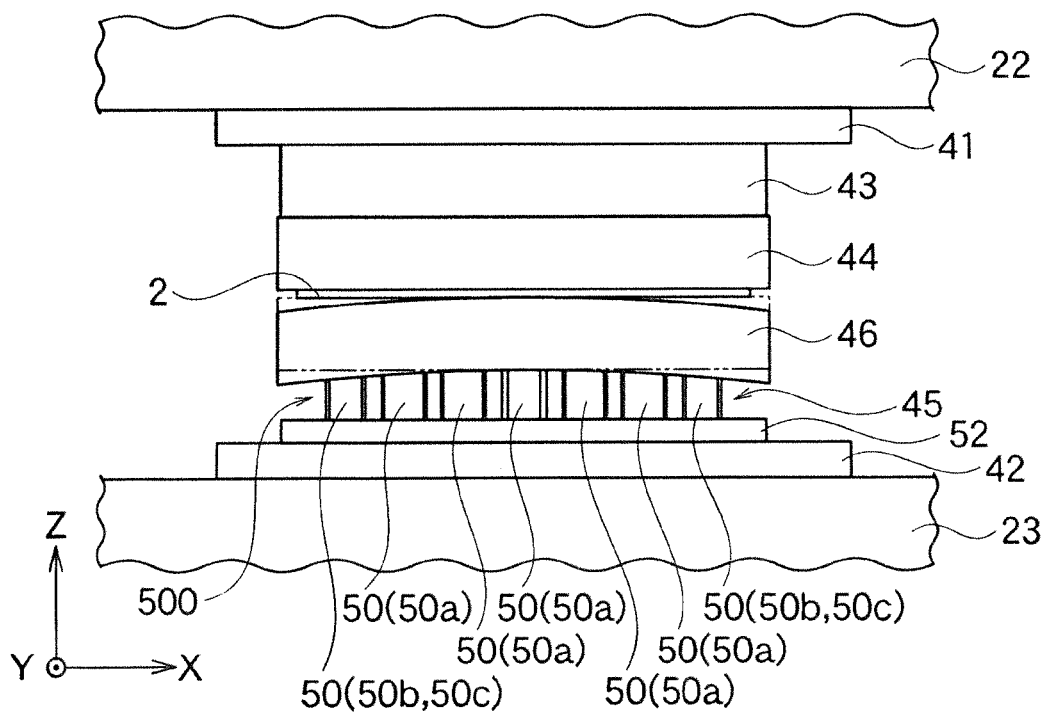
FIG. 3B is an enlarged side view showing when the lower jig plate of the substrate pressing portion shown in FIG. 3A is bent.

By supporting the lower jig plate 46 with the columnar member 50a having a relatively small strain amount at a position where the load applied to the lower jig plate 46 is relatively small, a relatively large supporting force can be provided to the lower jig plate 46 by the columnar member 50a so that the lower jig plate 46 bends less, and the amount of bending of the lower jig plate 46 can be adjusted to be small amount in accordance with the strain amount of columnar member 50a. That is, if no measures are taken, the center area of the lower jig plate 46 is bent in a concave shape, but in the present embodiment, bending becomes relatively small as shown in FIG. 3B. As a result, the load applied to the lower jig plate 46 can be increased, and the amount of load applied to the substrate 2 arranged on the lower jig plate 46 can be increased.

Also, by supporting the lower jig plate 46 with the columnar members 50b and 50c having relatively large strain amounts at position where the load applied to the lower jig plate 46 is relatively large, relatively small supporting force can be provided to the lower jig plate 46 by the columnar members 50b and 50c, so that the lower jig plate 46 bends easily, and bending of the lower jig plate 46 can be adjusted to a large amount of bending in accordance with the amounts of strain of the columnar members 50b and 50c. That is, if no measures are taken, the outer peripheral area of the lower jig plate 46 is hardly bent, but in the present embodiment, bending becomes relatively large as shown in FIG. 3B. As a result, load applied to the lower jig plate 46 can be reduced, and the amount of load applied to the substrate 2 arranged on the lower jig plate 46 can be reduced.

Figure 5A:
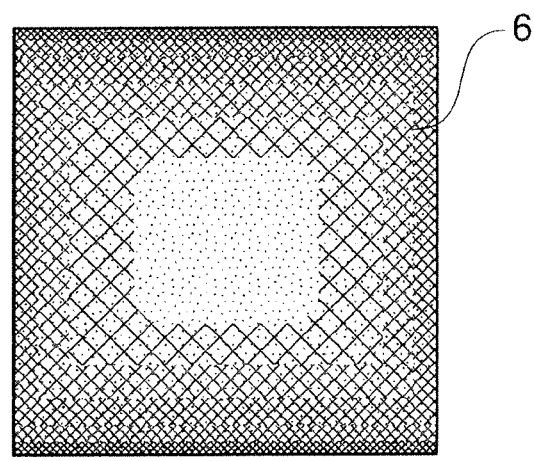
FIG. 5A is a diagram showing an in-plane distribution of load applied to a pressure sensitive paper when the lower jig plate is not supported by columnar members.
Figure 5B:
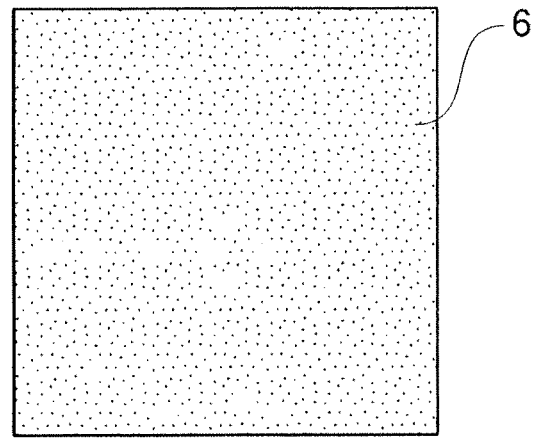
FIG. 5B is a diagram showing an in-plane distribution of load applied to the pressure sensitive paper when the lower jig plate is supported by the columnar members.

FIG. 5A is a diagram showing a distribution of load applied to the pressure sensitive paper 6 arranged on the lower jig plate 46 when the lower jig plate 46 (FIG. 3A) is mounted on a flat plate-shaped member (a member corresponding to the upper mounting portion 43) without using the support member 45 of the present embodiment (that is, FIG. 5A shows a comparative example). Also, FIG. 5B is a diagram showing a distribution of load applied to the pressure sensitive paper 6 arranged on the lower jig plate 46 when the lower jig plate 46 is supported by the support member 45 of the present embodiment (that is, FIG. 5B shows an example). In FIGS. 5A and 5B, the distribution of load applied to the pressure sensitive paper 6 matches the distribution of load applied to the substrate 2. In these figures, a portion with a darker color indicates that a relatively large load is applied, and a portion with a lighter color indicates that a relatively small load is applied.

As shown in FIG. 5A, in a comparative example, as it is closer to the center area of the pressure sensitive paper 6, load applied to the pressure sensitive paper 6 decreases in relativity; on the other hand, as it is closer to the outer peripheral area of the pressure sensitive paper 6, load applied to the pressure sensitive paper 6 increases in relativity. That is, in a comparative example, a relatively large bending is generated around the central area of the lower jig plate 46, while a relatively small bending is generated around the outer periphery of the lower jig plate 46.

On the contrary, as shown in FIG. 5B, in an example, load is uniformly applied to the pressure sensitive paper 6 at each position of the pressure sensitive paper 6. In the present embodiment, as shown in FIG. 3B, by bending the lower jig plate 46 so that the load applied to each position of the lower jig plate 46 is balanced out, the in-plane distribution of load applied to the lower jig plate 46 can be adjusted to be uniform as shown in FIG. 5B, and uniform load can be applied to the substrate 2 arranged on the lower jig plate 46.

The example shown in FIG. 4 shows an embodiment in which the in-plane distribution of load applied to the lower jig plate 46 is adjusted based on the difference of the strain amounts of the columnar members 50a, 50b, and 50c having different cross-sectional areas, however the embodiment for carrying out such adjustment is not limited thereto.

Figure 6A:
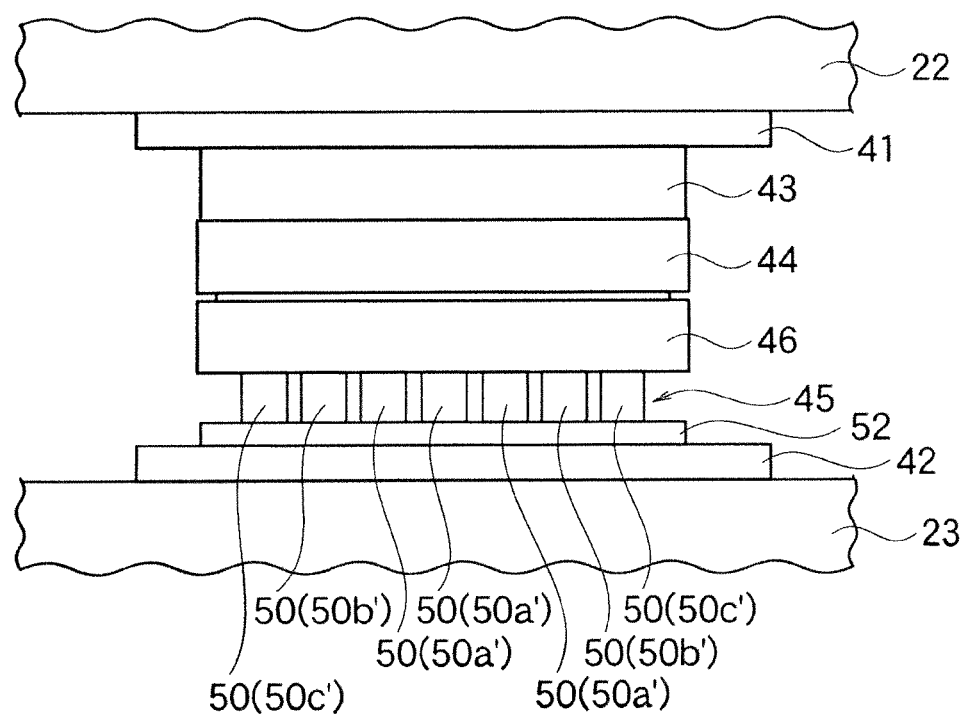
FIG. 6A is an enlarged side view showing a modification example of the support member shown in FIG. 3A.

For example, the support member 45 may adjust the in-plane distribution of load applied to the lower jig plate 46 by differences in the strain amounts based on the Young's moduli of the columnar members 50 when a certain load is applied. In the example shown in FIG. 6A, the columnar members 50a', 50b', and 50c' are made of members having different Young's moduli (mechanical strengths) or different hardness.

More specifically, the columnar member 50a' having a relatively large Young's modulus is arranged near the center area of the lower jig plate 46 where load applied to the lower jig plate 46 is relatively small. Also, the columnar member 50c' having a relatively small Young's modulus is arranged near the outer peripheral area of the lower jig plate 46 where load applied to the lower jig plate 46 is relatively large. Also, the columnar member 50b' having a relatively moderate Young's modulus is arranged at a position between the center area and the outer peripheral area of the lower jig plate 46 where load applied to the lower jig plate 46 is relatively moderate. That is, the Young's modulus of each of the columnar members 50a', 50b', and 50c' is in accordance with the in-plane distribution of load applied to the lower jig plate 46, and the Young's moduli of the columnar members 50 have a gradient in which the Young's moduli become smaller at a position farther away from the central area of the lower jig plate 46. Note that, the cross-sectional areas and shapes of the columnar members 50a', 50b', and 50c' are all the same.

In this case, when the lower jig plate 46 is supported by the plurality of columnar members 50a', 50b', and 50c', load is applied to the lower jig plate 46 by applying pressure to the substrate 2 using the upper jig plate 44. Along with that, load is applied to the columnar members 50a', 50b', and 50c', then the columnar members 50a', 50b', and 50c' are strained in accordance with the Young's moduli of the columnar members 50a', 50b', and 50c', and the lower jig plate 46 bends by the amount of bending in accordance with the stain amounts of the columnar members 50a', 50b', and 50c'.

That is, since a relatively small strain is generated to the columnar member 50a', a relatively small bending is generated to the center area of the lower jig plate 46. Also, since a relatively large strain is generated to the columnar member 50c', a relatively large bending is generated to the outer peripheral area of the lower jig plate 46. Also, since a relatively moderate strain is generated to the columnar member 50b', a relatively moderate bending is generated at a position between the center area and the outer peripheral area of the lower jig plate 46.

As described above, the columnar members 50a', 50b', and 50c' are strained in accordance with the in-plane distribution of load applied to the lower jig plate 46, and the lower jig plate 46 bends in accordance with the strain amounts of the columnar members 50a', 50b', and 50c', thereby the lower jig plate 46 can bend so that the load applied to each position of the lower jig plate 46 is balanced out (see FIG. 3B), and a uniform load can be applied to the substrate 2.

The Young's moduli E of the columnar members 50 may preferably be within a range of 100 GPa to 500 GPa. Also, a ratio Emax/Emin may preferably be within a range of 2/1 to 4/1 in which Emax represents the Young's modulus E of the columnar member 50a' having the largest Young's modulus and Emin represents the Young's modulus E of the columnar member 50c' having the smallest Young's modulus. By setting the range of the Young's modulus of each of the columnar members 50a', 50b', and 50c' within such range, the columnar members 50a', 50b', and 50c' can be bent appropriately in accordance with the in-plane distribution of the load applied to the lower jig plate 46. Note that, the support member 45 may include another columnar member 50 having a Young's modulus different from that of the columnar members 50a', 50b', and 50c'.

As a material having the Young's modulus described in above, the columnar members 50 are preferably made of a material such as carbon steel, silicon nitride, or silicon carbide.

Figure 6B:
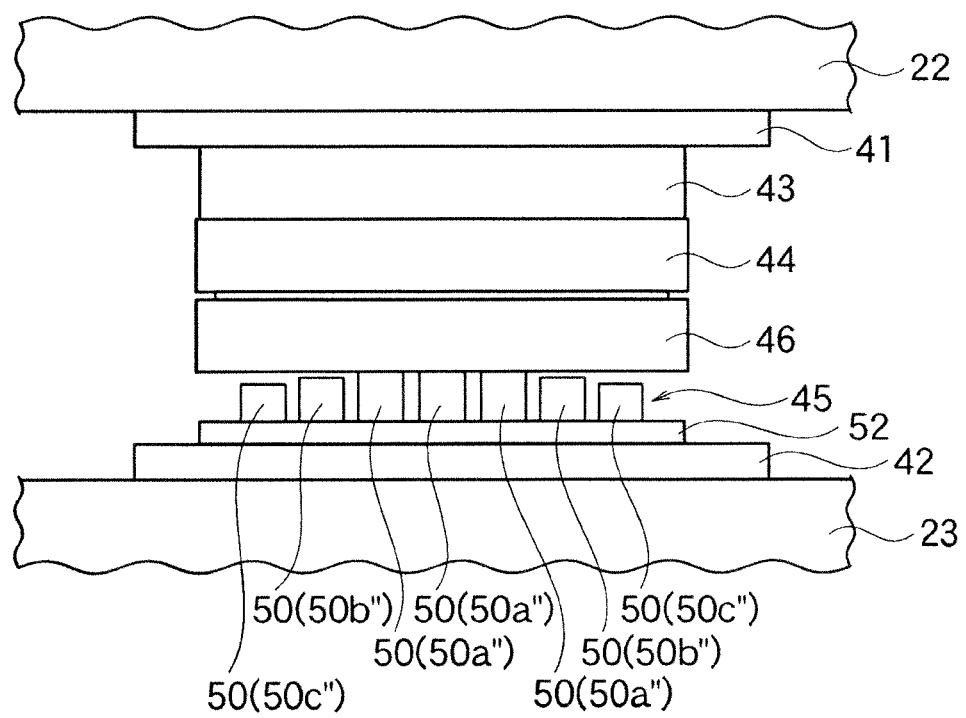
FIG. 6B is an enlarged side view showing another modification example of the support member shown in FIG. 3A.

Also, for example, the support member 45 may adjust the in-plane distribution of the load applied to the lower jig plate 46 by differences in lengths of the columnar members 50. In the example shown in FIG. 6B, columnar members 50a", 50b", and 50c" are formed of members having different lengths, and a height distribution is formed at a height position of an upper end of the columnar members 50a", 50b", and 50c".

More specifically, the columnar member 50a" having a relatively long length is arranged closer to the center area of the lower jig plate 46 where the load applied to the lower jig plate 46 is relatively small. Also, the columnar member 50c" having a relatively short length is arranged around the outer peripheral area of the lower jig plate 46 where the load applied to the lower jig plate 46 is relatively large. Also, a columnar member 50b" having a relatively moderate length is arranged at a position between the center area and the outer peripheral area of the lower jig plate 46 where the load applied to the lower jig plate 46 is relatively moderate. That is, the length of each of the columnar members 50a", 50b", and 50c" has a value which matches the in-plane distribution of the load applied to the lower jig plate 46, and the lengths of the columnar members 50 (the height position of the upper end) are arranged so that a height gradient is formed which becomes shorter as it is further away from the center area of the lower jig plate 46. Note that, the cross-sectional areas and Young's moduli of the columnar members 50a", 50b", and 50c" are all the same.

In this case, when the lower jig plate 46 is supported by the columnar members 50a", 50b", and 50c", load is applied to the lower jig plate 46 by applying pressure to the substrate 2 using the upper jig plate 44. Along with that, load is applied to the columnar members 50a", 50b", and 50c", and the lower jig plate 46 bends in accordance with the lengths of the columnar members 50a", 50b", and 50c".

That is, relatively small bending is generated to the area close to the center of the lower jig plate 46 where the columnar member 50a" is arranged. Also, a relatively large bending is generated to the outer peripheral area of the lower jig plate 46 where the columnar member 50c" is arranged. Also, a relatively moderate bending is generated at a position between the center area and the outer peripheral area of the lower jig plate 46 where the columnar member 50b" is arranged. As such, the columnar members 50a", 50b", and 50c" having different lengths are arranged in accordance with the in-plane distribution of load applied to the lower jig plate 46, and the lower jig plate 46 is bent by the amount of bending in accordance with the lengths of the columnar members 50a", 50b", and 50c", thereby the lower jig plate 46 bends in a way that the load applied to each position of the lower jig plate 46 is balanced out (see FIG. 3B), and a uniform load can be applied to the substrate 2. Note that, the support member 45 may include other columnar members 50 having a length different from that of the columnar members 50a", 50b", and 50"c.

Note that, bending of the lower jig plate 46 can be done more easily and more accurately by adjusting the material (Young's modulus) or the diameter (cross-sectional area) of the columnar members 50 than by adjusting the height of the columnar members 50.

Figure 7A:
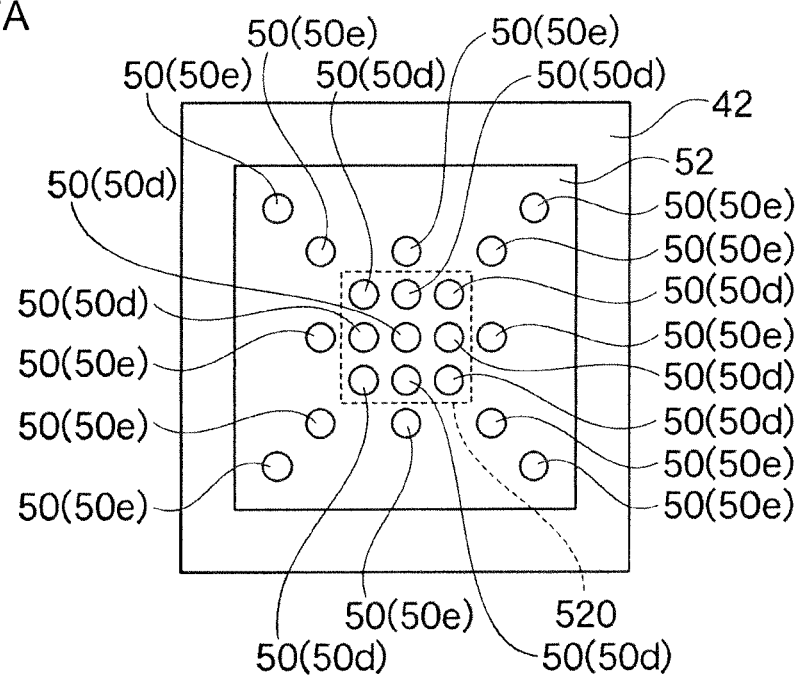
FIG. 7A is a diagram showing another arrangement example of the columnar members.

The arrangement of the columnar members 50 is not limited to the example shown in FIG. 4, and for example, the columnar members 50 may be arranged as shown in FIG. 7A. In the example shown in FIG. 7A, nine columnar members 50d are arranged in a matrix form of 3 rows and 3 columns in a center area 520 of the installation portion 52 which is indicated by a dotted line. Also, columnar members 50e are locally arranged at outside the center area 520 of the installation portion 52. The columnar members 50d and 50e are arranged so as to extend radially from the center of the installation portion 52. The columnar members 50d are arranged in a relatively high density to the center area 520 of the installation portion 52, and the columnar members 50e are arranged in a relatively low density to outside of the center area 520 of the installation portion 52.

That is, in the example shown in FIG. 7A, at a position (central region 520) where load applied to the lower jig plate 46 (FIG. 1B) is relatively small, a relatively more columnar members 50d are densely arranged than at a position (outside of the center area 520) where the load applied to the lower jig plate 46 is relatively large.

Figure 7B:
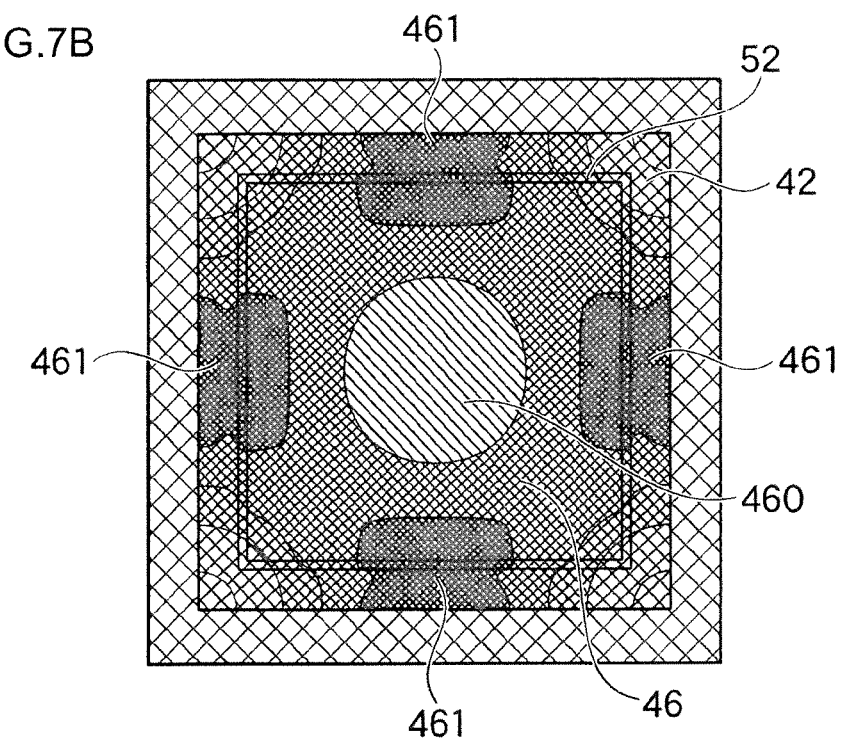
FIG. 7B is a diagram showing an in-plane distribution of load applied to the substrate or the lower jig plate when the columnar members are arranged in an arrangement shown in FIG. 7A.

FIG. 7B shows a result of analyzing a distribution of bending generated to the lower jig plate 46 using CAE (Computer Aided Engineering) analysis when the lower jig plate 46 is supported by the columnar members 50d and 50e shown in FIG. 7A. In these figures, a portion with a darker color indicates a relatively large bending, and a portion with a lighter color indicates that a relatively small deflection.

As shown in FIG. 7B, since the center area 460 of the lower jig plate 46 which matches the center area 520 of the installation portion 52 is supported by a relatively more columnar members 50d, at the center area 460, a relatively large supporting force is provided to the lower jig plate 46 by the columnar members 50d, thus the lower jig plate 46 bends less. That is, in the center area 460, bending generated to the lower jig plate 46 is adjusted to a small bending amount in accordance with the density (number) of the columnar members 50*d*, and a relatively small bending is generated to the center area 460. As a result, the load applied to the lower jig plate 46 increases.

On the other hand, since the area outside the center area 460 of the lower jig plate 46 is supported by a relatively fewer columnar members 50*e*, in this area, a relatively small supporting force is provided to the lower jig plate 46 by the columnar members 50*e*, thus the lower jig plate 46 tends to bend easily. That is, in the area outside the center area 460, bending generated to the lower jig plate 46 is adjusted to a large bending amount in accordance with the density (number) of the columnar members 50*e*, and a relatively large bending is generated to the area. As a result, the load applied to the lower jig plate 46 decreases.

In particular, in the side area 461 of the lower jig plate 46 which is not supported by the columnar member 50*e*, the lower jig plate 46 bends particularly easily, and the amount of bending of the lower jig plate 46 is particularly large compared to other areas.

As such, by arranging the columnar members 50*d* and 50*e* in accordance with the in-plane distribution of the load applied to the lower jig plate 46, bending of the lower jig plate 46 is adjusted in accordance with the arrangement of the columnar members 50*d* and 50*e* so that the load applied to each position of the lower jig plate 46 is balanced out, and a uniform load can be applied to the substrate 2 arranged on the lower jig plate 46.

Depending on the in-plane distribution of load applied to the lower jig plate 46, the columnar members 50 are appropriately installed to the installation portion 52 using at least one arrangement shown in FIGS. 4 and 7A. Note that, the columnar members 50 may be installed to the installation portion 52 in an arrangement other than the arrangements shown in FIGS. 4 and 7A.

Also, as described above, when the lower jig plate 46 is not supported by the support member 45, there is a problem that the closer it is to the center area of the lower jig plate 46, the larger the relative bending of the lower jig plate 46 is, and the closer it is to the outer periphery of the lower jig plate 46, the smaller the relative bending of the lower jig plate 46 is. The above-mentioned embodiments have solved such problem. When the lower jig plate 46 is not supported by the support member 45, there may be a case that the closer it is to the center area of the lower jig plate 46, the smaller the relative bending is, and the closer it is to the outer peripheral area of the lower jig plate 46, the larger the relative bending is. In this case, the in-plane distribution of the load applied to the lower jig plate 46 is roughly the opposite of the in-plane distribution of load shown in FIG. 5A, and load applied to the center area of the lower jig plate 46 becomes relatively large, while load applied to the outer peripheral area of the lower jig plate 46 becomes relatively small.

In such case, the material (Young's modulus), shape, arrangement, and so on of the columnar members 50 arranged on the installation portion 52 may be selected appropriately so that the columnar member 50 arranged closer to the center area of the lower jig plate 46 has a larger strain and the columnar member 50 arranged closer to the outer peripheral area of the lower jig plate 46 has a smaller strain. For example, for the columnar members 50 arranged closer to the center area of the lower jig plate 46, those with smaller Young's modulus or smaller diameter may be used; and for the columnar members 50 arranged closer to the outer peripheral area of the lower jig plate 46, those with larger Young's modulus or larger diameter may be used.

When the lower jig plate 46 is supported by the columnar members 50 having such strain characteristics, the lower jig plate 46 bends easily at a position closer to the center area, and load applied to the lower jig plate 46 can be reduced. As a result, load applied to the substrate 2 arranged on lower jig plate 46 at said position can be also reduced.

Also, at a position closer to the outer periphery of the lower jig plate 46, the lower jig plate 46 bends less, and the load applied to the lower jig plate 46 can be increased. As a result, the load applied to the substrate 2 arranged on the lower jig plate 46 at said position can be increased.

As shown in FIG. 3A, the installation portion 52 is formed of a plate-shaped body having a roughly flat plate shape, and functions to support the columnar members 50 so that the columnar members 50 are held upright. Also, the installation portion 52 functions to support the heat dissipating column 53 (FIG. 8) in addition to the columnar members. The installation portion 52 has installation holes (not shown in the figures) for installing the columnar members 50 and so on. Lower ends of the columnar members 50 can be inserted into and fixed to the installation holes. The number of installation holes may be the same as the number of columnar members 50, or may be more than the number of columnar members 50. Each of the columnar members 50 may be fixed to the installation portion 52 (installation hole) using a joining member such as a bolt, or may be fixed to the installation portion 52 (installation hole) using a connecting member such as an adhesive.

Note that, the installation holes are not essential to the installation portion 52, and the columnar members 50 may be fixed using a joining member or a connecting member to the surface of the installation portion 52 having a planar shape (flat shape). Alternatively, the columnar members 50 may simply be in contact with the surface of the installation portion 52. Among the columnar members 50 shown in FIG. 4, the columnar member 50*a*1 positioned at the center may preferably be fixed to the installation portion 52 using a joining member, an adhesive member, or the like.

Figure 8:
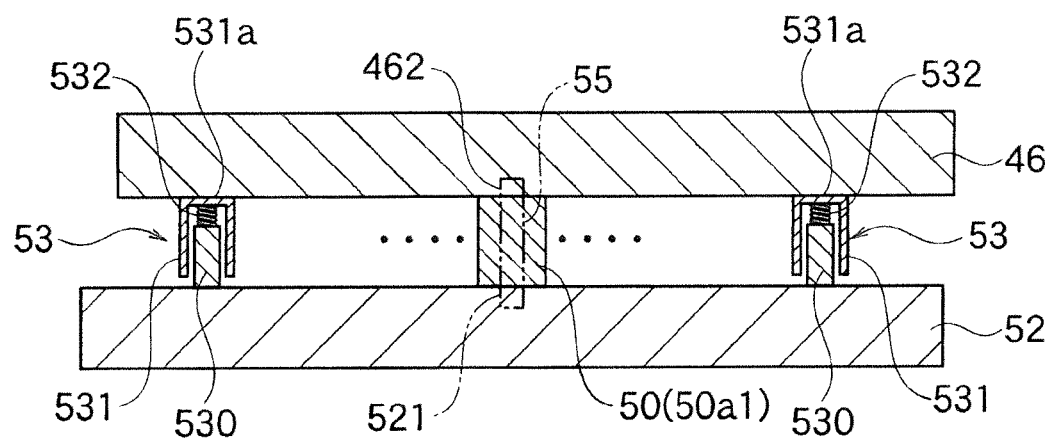
FIG. 8 is a cross-sectional diagram showing when a heat dissipating column is arranged in addition to the columnar members under the lower jig plate.

Also, the columnar member 50*a*1 may be preferably fixed to the lower face of the lower jig plate 46 using the joining member, the bonding member, or so. As shown in FIG. 8, by fixing only the columnar member 50*a*1 among the columnar members 50 to the lower face of the lower jig plate 46 using the joining member 54, bending of the lower jig plate 46 can be adjusted to be small at the center area of the lower jig plate 46, and the load applied to the lower jig plate 46 can be made relatively large. Note that, in the example shown in FIG. 8, the columnar member 50*a*1 is fixed to both the lower jig plate 46 and the installation portion 52 using the joining member 55. The joining member 55 may be made from various fastening members such as bolts, pins, and so on.

When pressure is applied to the substrate 2 through the upper jig plate 44 (FIG. 3A), due to heating of the upper jig plate 44 and the lower jig plate 46, the lower jig plate 46 and so on may be heat deformed. Thus, in the conventional technology, it was difficult to apply uniform load to the substrate 2. Thus, in the substrate processing apparatus 10 according to the present embodiment, in order to prevent such problem, the heat dissipating columns 53 having higher heat dissipation property than the columnar members 50 are directly in contact with the lower jig plate 46 which is as shown in FIG. 8. In below, the heat dissipating column 53 is described in detail.

The heat dissipating columns 53 are provided to the positions where relatively large load is applied to the lower jig plate 46. That is, at the outer periphery portion of the lower jig plate 46, the load applied to the lower jig plate 46 becomes large. Thus, as mentioned in above and as shown in FIG. 4, in the present embodiment, the columnar members 50b and 50c having relatively small cross-sectional areas are arranged to the outer periphery portion of the lower jig plate 46 in order to reduce said large load applied to the outer periphery portion of the lower jig plate 46.

Also, at the center area of the lower jig plate 46, the load applied to the lower jig plate 46 becomes relatively small. Thus, the columnar member 50a having a relatively large cross-sectional area is arranged at the center area of the lower jig plate 46 in order to increase this load. Alternatively, at the outer periphery portion of the lower jig plate 46, the load applied to the lower jig plate 46 becomes relatively large. Thus, as shown in FIG. 7A, a relatively small number of columnar members 50e are arranged to the outer periphery portion of the lower jig plate 46 in order to reduce this load. Also, at the center area of the lower jig plate 46, the load applied to the lower jig plate 46 becomes relatively small. Thus, a relatively large number of columnar members 50d are arranged at the center area of the lower jig plate 46 in order to increase this load.

As such, when the columnar members 50d are densely arranged or the columnar member 50a with large cross-sectional area is arranged at the center area of the lower jig plate 46, these columnar members 50 facilitate heat dissipation at the center area of the lower jig plate 46, thus the temperature of the lower jig plate 46 tends to be lower compared to the outer periphery portion of the lower jig plate 46. Also, in the example shown in FIG. 7A, at the outer periphery portion of the lower jig plate 46, there is an area where the columnar member 50d is not arranged, and in such area, the temperature of the lower jig plate 46 tends to become high. Thus, if no measures were taken, the temperature at the center area of the lower jig plate 46 becomes lower than the outer periphery portion of the lower jig plate 46, and the temperature difference between the center area and the outer periphery portion of the lower jig plate 46 tends to occur.

Thus, in the present embodiment, in order to decrease the temperature difference between the center area and the outer periphery portion of the lower jig plate 46, the heat dissipating columns 53 are provided to the installation portion 52 in accordance with the in-plane distribution of temperature in the lower jig plate 46. More specifically, the heat dissipating columns 53 are arranged to the position where the temperature of the lower jig plate 46 becomes relatively high (that is, the outer periphery portion of the lower jig plate 46 where the load applied to the lower jig plate 46 becomes large). Thereby, heat dissipation through the heat dissipating columns 53 at the outer periphery portion of the lower jig plate 46 is facilitated, and the temperature of the outer periphery portion of the lower jig plate 46 can be lowered. As a result, the temperature at the center area of the lower jig plate 46 and the temperature at the outer periphery portion of the lower jig plate 46 can be balanced, and the temperature difference between the center area and the outer periphery portion of the lower jig plate 46 can be prevented.

As such, the heat dissipating column 53 functions as a cooling system, and by contacting the heat dissipating column 53 to the area where the temperature of the lower jig plate 46 is high, such area can be cooled.

The number of heat dissipating columns 53 may be determined accordingly depending on the temperature difference at each area of the lower jig plate 46. For example, in the case that the temperature of the outer periphery portion of the lower jig plate 46 is significantly higher than the temperature of the center area, relatively more numbers of the heat dissipating columns 53 may be preferably provided to the position corresponding to the outer periphery portion of the lower jig plate 46. Alternatively, the heat dissipating columns 53 may be densely installed as collective body of heat dissipating columns 53, or relatively more numbers of the heat dissipating columns 53 may be scattered.

Also, in the case that the temperature of the outer periphery portion and the temperature of the center area of the lower jig plate 46 are not significantly different, then relatively small numbers of heat dissipating columns 53 may be installed.

At the outer periphery portion of the lower jig plate 46, in addition to the columnar members 50, the heat dissipating columns 53 may be arranged to the area where the columnar members 50 are arranged. In this case, the heat dissipating columns 53 may be arranged between the columnar members 50 so that the heat dissipating columns 53 is placed between (surrounded by) the columnar members 50. Alternatively, at the outer periphery portion of the lower jig plate 46, the heat dissipating columns 53 may be arranged to the area where the columnar members 50 are not arranged.

Figure 9:
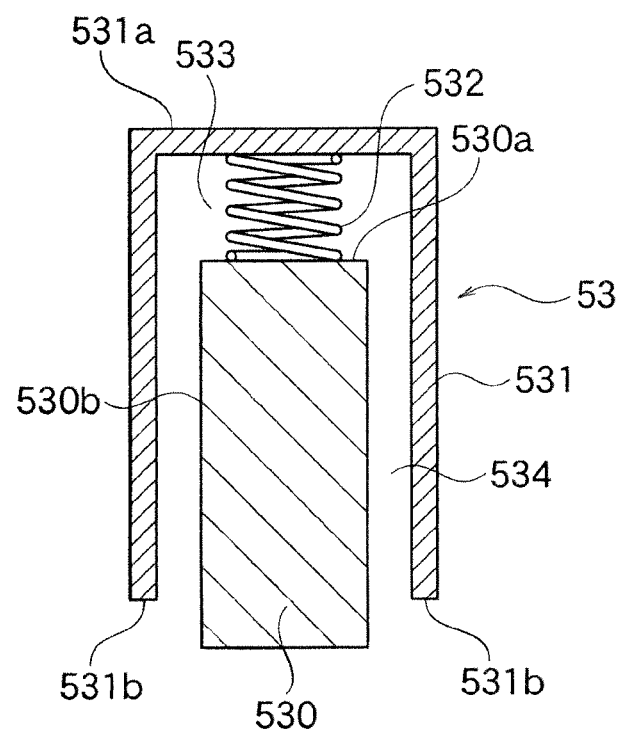
FIG. 9 is an enlarged cross-sectional diagram showing a structure of the heat dissipating column shown in FIG. 8.

As shown in FIG. 9, the heat dissipating column 53 includes a column main body 530, a cover portion 531, and a resilient portion 532. The column main body 530 is made of a columnar member, and it is installed to the upper face of the installation portion 52 in an upright condition. A length of the column main body 530 is shorter than the length of the columnar member 50, and shorter than a distance between the upper face of the installation portion 52 and the lower face of the lower jig plate 46 (see FIG. 8). The column main body 530 may be made of the same material as the columnar member 50, or it may be made of different member as the columnar member 50. For example, the column main body 530 may be made of a member with a lower rigidity (Young's modulus) than the columnar member 50 (particularly, the columnar member 50 arranged at the outer periphery portion of the lower jig plate 46).

Also, a diameter of the column main body 530 may be smaller than the diameter of the columnar member 50. In the present embodiment, the diameter of the column main body 530 may be smaller than the diameter of the column member 50a arranged at the center area of the lower jig plate 46, or it may be smaller than the diameter of the columnar member 50 arranged at the outer periphery portion of the lower jig plate 46. The column main body 530 may be fixed to the surface of the installation portion 52 of a planar shape (flat shape) using a connecting member such as adhesives and so on, or it may be fixed to the installation portion 52 using a joining member described in below.

The resilient portion 532 is made of a resilient member, and for example, it may be a spring, a rubber, and so on. The resilient portion 532 may preferably made of a member having a high thermal conductivity such as stainless or so. One end of the resilient portion 532 is connected to the top portion 530a of the column main body 530, and the other end of the resilient portion 532 is connected to the inner face of the cover portion 531.

The cover portion 531 is a cylinder shape with bottom, and the cross-section shape is roughly a C-shape. The cover portion 531 is made of a member having a higher heat dissipating property (higher thermal conductivity) than the column main body 530, and the cover portion 531 covers (the surface of) the column main body 530. The cover portion 531 is made of a member with a high thermal conductivity, and as a member constituting the cover portion 531, aluminum, iron, silver, copper and an alloy including at least one selected from these may be mentioned. Note that, the column main body 530 may be made of these members with high thermal conductivity. By contacting the cover portion 531 to the lower face of the lower jig plate 46, heat of the lower jig plate 46 can be effectively release to outside through the cover portion 531. Note that, heat transferred to the cover portion 531 from the lower jig plate 46 may be partially released to the installation portion 52 or the lower stage 42 (FIG. 3A) through the resilient portion 532 and the column main body 530.

The cover portion 531 is attached to the top portion 530a of the column main body 530, the resilient portion 532 is provided between the cover portion 531 and the top portion 530a of the column main body 530. The top portion 530a of the column main body 530 and the inner face of the cover portion 531 has a first space 533 in between, and a side portion 530b of the column main body 530 and the inner face of the cover portion 531 has a second space 534 in between. Note that, the second space 534 may be omitted, and the cover portion 531 may be in direct contact with the side portion 530b of the column main body 530. The cover portion 531 can move in vertical direction by receiving resilient force from the resilient portion 532, and the cover portion 531 can move in horizontal direction by receiving resilient force from the resilient portion 532.

As shown in FIG. 8, when the heat dissipating column 53 is installed to the installation portion 52, the upper face 531a of the cover portion 531 is firmly in contact with the lower face of the lower jig plate 46. The opening edge 531b of the cover portion 531 does not contact the upper face of the installation portion 52, and it is arranged at the position taking a predetermined space from the upper face of the installation portion 52. Note that, the cover portion 531 may be configured so that the opening edge 531b is in contact with the upper face of the installation portion 52.

As shown in FIG. 3B, in the present embodiment, the columnar members 50 with relatively large strain amounts are arranged at the positions corresponding to the outer periphery portion of the lower jig plate 46. Thus, when pressure is applied through the upper jig plate 44 while the outer periphery portion of the lower jig plate 46 is supported by the columnar members 50, the outer periphery portion of the lower jig plate 46 will bend relatively large. When the bending of the outer periphery portion of the lower jig plate 46 acts on the heat dissipating column 53, the resilient portion 532 shown in FIG. 9 resiliently deforms along the bending direction of the lower jig plate 46. Also, in accordance with this, the cover portion 531 receives resilient force from the resilient portion 531, and moves along the deformation direction of the resilient portion 532 while the cover portion 531 and the lower face of the lower jig plate 46 are in contact. As a result, the height position of the upper face 531a of the cover portion 531 moves up and down in accordance with bending of the lower jig plate 46 or with the resilient deformation of the resilient portion 532.

The pressing force of the upper face 531a of the cover portion 531 which is pressing the lower face of the lower jig plate 46 using resilient force of the resilient member 532 is sufficiently smaller than a supporting force provided to the lower jig plate 46 from the columnar members 50 (in the example shown in FIG. 4, the columnar members 50b and supporting the outer periphery portion of the lower jig plate 46. Therefore, the adjustment ability of the columnar members 50 which adjust the in-plane distribution of bending of the lower jig plate 46 is not interfered by the heat dissipating column 53. Therefore, while adjusting the in-plane distribution of bending of the lower jig plate 46 using the columnar members 50, heat dissipation at the outer periphery portion of the lower jig plate 46 can be facilitated through the heat dissipating column 53.

Figure 10A:
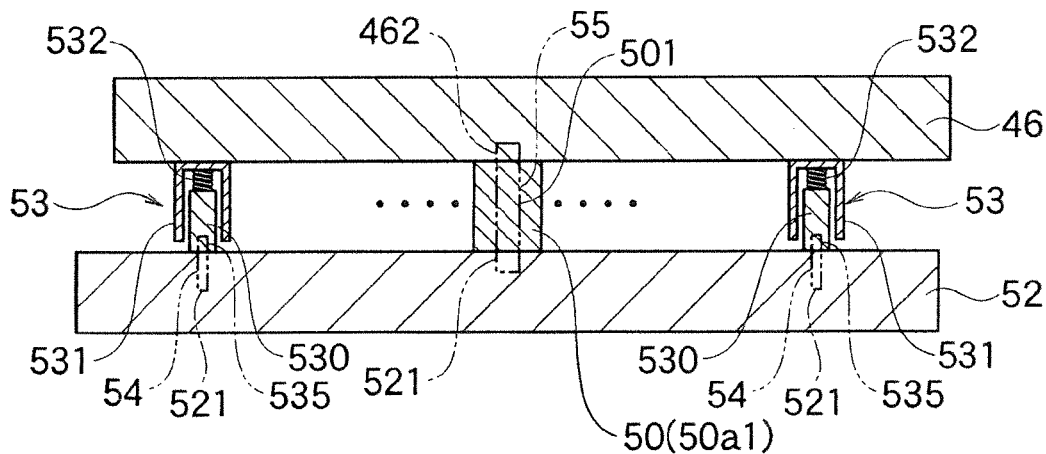
FIG. 10A is a cross section diagram showing a modification example of fixing embodiment of the heat dissipating column shown in FIG. 8.
Figure 10B:
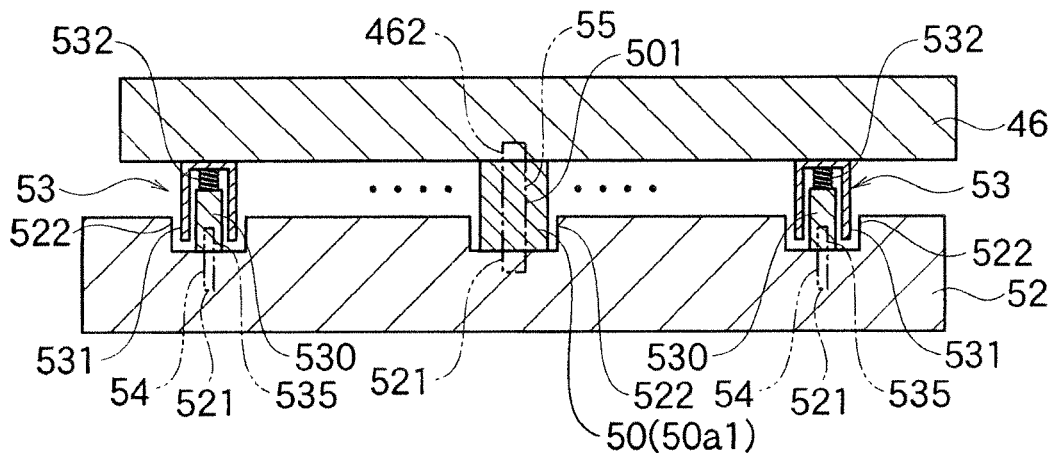
FIG. 10B is a cross section diagram showing a modification example of fixing embodiment of the heat dissipating column shown in FIG. 10A.
Figure 10C:
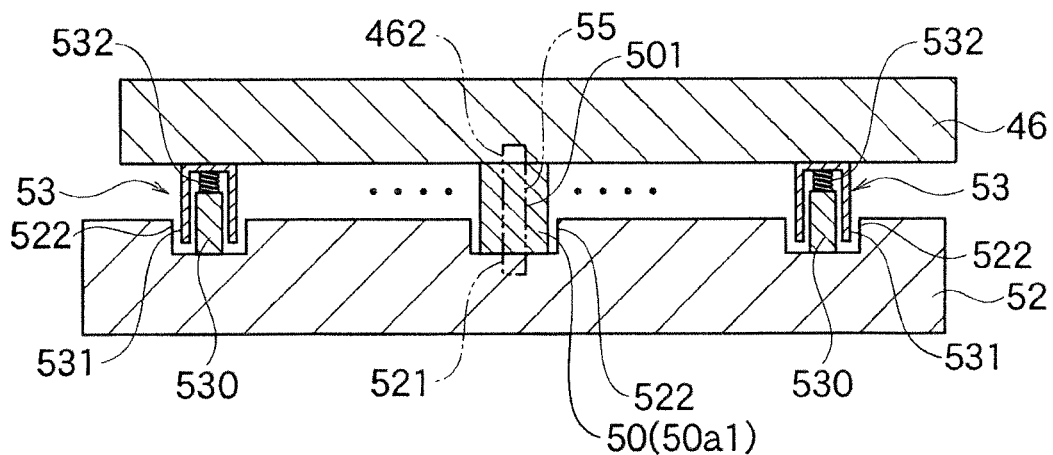
FIG. 10C is a cross section diagram showing a modification example of fixing embodiment of the heat dissipating column shown in FIG. 10B.

As shown in FIGS. 10A to 10C, the heat dissipating column 53 can be fixed to the installation portion 52 using various embodiments. For example, as shown in FIG. 10A, the heat dissipating column 53 may be joined to the installation portion 52 using a joining member (non-penetrating type joining member) 54. In the example shown in FIG. 10A, a joining depression 535 is formed to the heat dissipating column 53, and a joining depression 521 is formed to the installation portion 52. One end of the joining member 54 is inserted inside the joining depression 521, and screwed (engaged) to the joining depression 521. Also, the other end of the joining member 54 is inserted in the joining depression 535, and screwed (engaged) to the joining depression 535. Thereby, the heat dissipating column 53 can be fixed to the installation portion 52 using the joining member 54. The joining member 54 may be made of a fastening member such as bolts and pins, or any other joining member.

Note that, the columnar member 50 (50a1) is physically joined to the installation portion 52 and the lower jig plate 46 using the joining member (penetrating-type joining member) 55. The joining member 55 penetrates in the through hole 501 formed to the columnar member 50 (50a1), and engages with the through hole 501. The upper end of the joining member 55 is inserted in the joining depression 462 formed to the lower face of the lower jig plate 46, and engages with the joining depression 462. The lower end of the joining member 55 is inserted in the joining depression 521 formed to the installation portion 52, and engages with the joining depression 521.

Thereby, the installation portion 52, the columnar member 50 (50a1), and the lower jig plate 46 are physically joined using the joining member 55, and also the columnar member 50 (50a1) is firmly fixed (held between) the installation portion 52 and the lower jig plate 46. By joining the columnar member 50 (50a1) not only with the lower jig plate 46 but also with the installation portion 52, bending of the lower jig plate 46 can be effectively prevented at the position where said columnar member 50 (50a1) is arranged.

Also, as shown in FIG. 10B, the heat dissipating column 53 may be inserted in an installation hole 522 formed to the installation portion 52. In the example shown in FIG. 10B, the installation hole 522 is formed on the upper face of the installation portion 52, and the joining depression 521 is formed at the bottom face of the installation hole 522. One side of the joining member 54 is inserted in the joining depression 521, and engages with the joining depression 521. Also, the other side of the joining member 54 is inserted in the joining depression 535, and engages with the joining depression 535. Thereby, the heat dissipating column 53 can be fixed to the installation portion 52 using the joining member 54. As such, by inserting the heat dissipating column 53 in the installation hole 522, the position shifting of the heat dissipating column 53 can be prevented, and also the position of the heat dissipating column 53 against the installation portion 52 can be determined easily.

Note that, as similar to the heat dissipating column 53, the columnar member 50 (50a1) is also inserted in the installation hole 522 formed to the installation portion 52, and while in this condition, it is joined to the installation portion 52 and the lower jig plate 46 using the joining member 55.

Also, in the example shown in FIG. 10C, the heat dissipating column 53 is not joined to the installation portion 52 using the joining member 54 shown in FIG. 10B, and it is simply only inserted in the installation hole 522. Note that, the heat dissipating column 53 may be fixed to the bottom face of the installation hole 522 using a connecting member such as adhesives and so on. Also, the diameter of the installation hole 522 may be made about the same size as the diameter of the column main body 530 of the heat dissipating column 53 to tightly place the column main body 530 in the installation hole 522 so that the column main body 530 does not fall out.

Figure 11A:
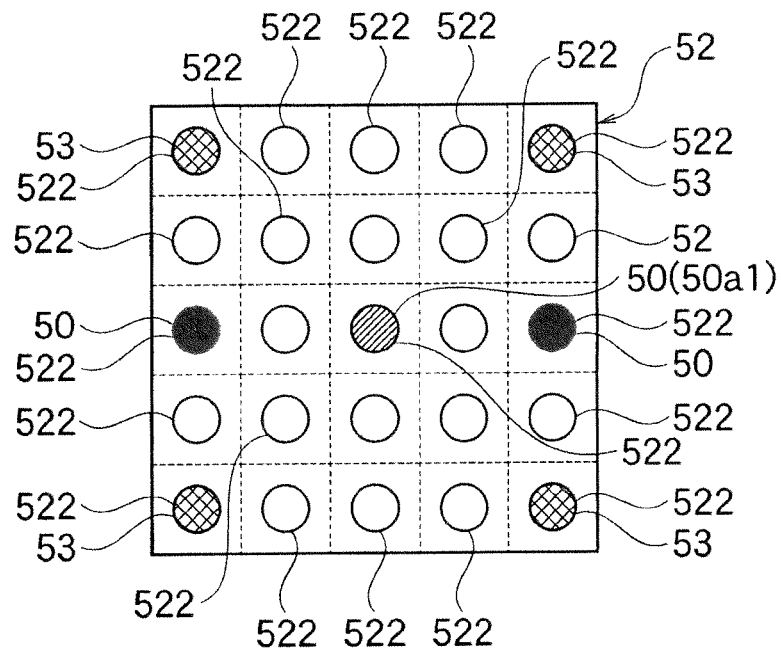
FIG. 11A is a diagram showing an example of arrangement of the heat dissipating column shown in FIG. 8.

As shown in FIG. 11A, in the case that the installation holes 522 are formed in a matrix form of 5 rows and 5 columns to the installation portion 52, the columnar members 50 and the heat dissipating columns 53 may be installed to arbitrary installation holes 522 among the entire installation holes. The columnar members 50 may be preferably installed to the installation holes 522 in accordance with the in-plane distribution of load applied to the lower jig plate 46.

In the figures, the black color part and the shaded line part indicate that the columnar member 50 is installed in the installation hole 522. Particularly, the shaded part indicates the columnar member 50 joined to the lower jig plate 46 and the installation portion 52 using the joining member 55 shown in FIG. 10A. Also, the black color part indicates the columnar member 50 joined to the installation portion 52 using the joining member 54 shown in FIG. 10A, or the columnar member 50 simply installed to the installation hole 522 without using the joining member 54. Also, in the figures, the hatching part indicates that the heat dissipating column 53 is installed to the installation hole 522.

As shown in FIG. 11A, the columnar member 50 (50a1) is installed to the installation hole 522 positioned at the center of the installation portion 52, and the columnar member 50 (50a1) is joined to the installation hole 52 and the lower jig plate 46 using the joining member 55 shown in FIG. 10A. Thereby, the center area of the lower jig plate becomes difficult to bend, thus relatively large load can be applied to the center area of the lower jig plate 46.

Among the installation holes 522 formed in a matrix form of 5 rows and 5 columns, to the installation holes 522 positioned in the outermost periphery of the installation portion 52, two columnar members 50 and four heat dissipating columns 53 are installed. The two columnar members 50 are joined to the installation portion 52 using the joining member 54 shown in FIG. 10A, or simply only installed to the installation holes 522, and these are not joined to the lower jig plate 46.

Also, the four heat dissipating columns 53 are respectively installed to the installation holes 522 positioned to the four corners of the installation portion 52. The four heat dissipating columns 53 are installed to the installation holes 522 in an embodiment shown in FIG. 10B and FIG. 10C. As such, the heat dissipating columns 53 are preferably installed at the outer periphery portion of the installation portion 52, that is at the position corresponding to the outer periphery portion of the lower jig plate 46. At said position, the heat dissipation property is lower compared to the center area of the lower jig plate 46 where the columnar member 50 (50a1) is arranged, thus by installing the heat dissipating columns 53 at such position, the heat dissipation property at the outer periphery portion of the lower jig plate 46 can be enhanced. Note that, in the example shown in the figures, the heat dissipating columns 53 are installed to the installation holes 522 located at the outermost periphery of the installation portion 52, however, the heat dissipating column 53 may be installed to the installation holes 522 located at inside than these.

Figure 11B:
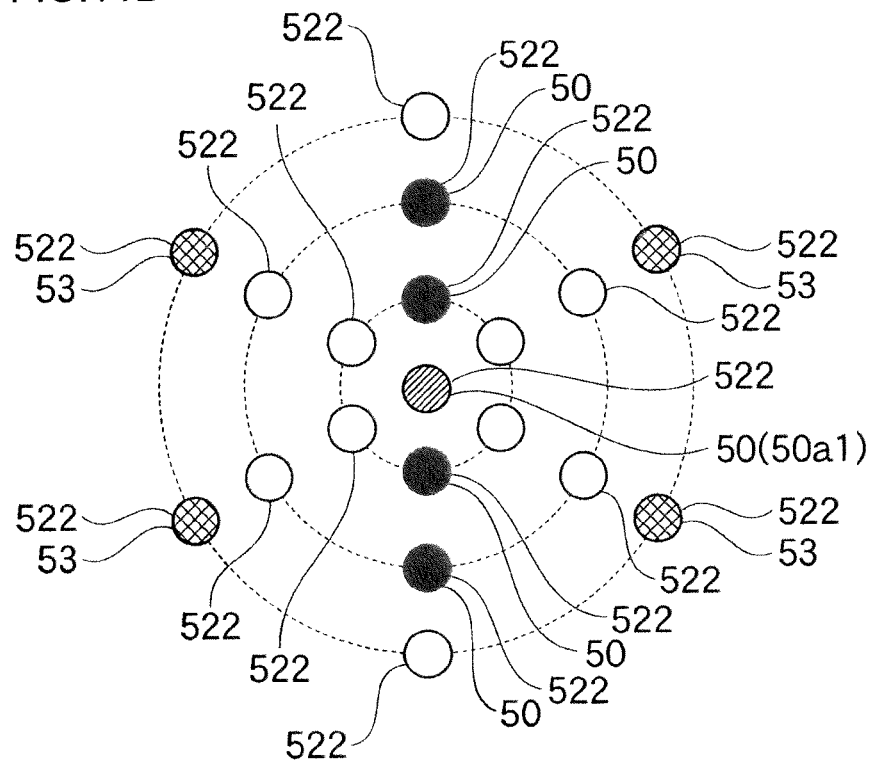
FIG. 11B is a diagram showing another example of arrangement of the heat dissipating column shown in FIG. 8.

Also, in the example shown in FIG. 11B, the installation holes 522 are formed in a concentric manner on the installation portion 52, and among these installation holes 522, the columnar members 50 and the heat dissipating columns 53 are installed to arbitrary installation hole 522. More specifically, as shown in the example of FIG. 11A, the columnar member 50 (50a1) is installed to the installation hole 522 positioned at the center of the installation portion 52, and the columnar member 50 (50a1) is joined to the installation portion 52 and the lower jig plate 46 using the joining member 55 shown in FIG. 10A.

Two columnar members 50 are installed to the installation holes 522 positioned on a circle arranged at the position closest to the center of the installation portion 52. Also, two columnar members 50 are installed to the installation holes 522 positioned on a circle outside of the above-mentioned circle. These columnar members 50 are joined to the installation portion 52 using the joining member 54 shown in FIG. 10A or these may be simply installed to the installation hole 522 and not joined to the lower jig plate 46.

Also, the four heat dissipating columns 53 are installed to the installation holes 522 positioned on a circle arranged on the position furthest from the center of the installation portion 52. The four heat dissipating columns 53 are installed to the installation holes 522 in the embodiment shown in FIG. 10B and FIG. 10C. Even in the case that the installation holes 522 are arranged in a concentric manner, by installing the heat dissipating columns 53 to the outer peripheral portion of the installation portion 52, the heat dissipating property of the lower jig plate 46 can be enhanced.

Note that, in the examples shown in FIG. 11A and FIG. 11B, the installation holes 522 are arranged to the installation portion 52 in a matrix form or a concentric manner, however, the installation holes 522 may be randomly arranged to the installation portion 52. Even in this case, the heat dissipating columns 53 may preferably be installed to the installation holes 522 positioned to the outer periphery portion of the installation portion 52.

The heat dissipating columns 53 is installed as described above, assuming that the temperature of the lower jig plate 46 becomes relatively lower as it becomes closer to the center area of the lower jig plate 46, and the temperature of the lower jig plate 46 becomes relatively higher as it becomes closer to the outer periphery portion of the lower jig plate 46. However, on the contrary to this, depending on the installation embodiments of the columnar members 50, the temperature of the lower jig plate 46 may become relatively higher as it is closer to the center area of the lower jig plate 46, and the temperature of the lower jig plate may become relatively lower as it is closer to the outer periphery portion of the lower jig plate 46. In such case, the heat dissipating columns 53 are installed at the center area of the lower jig plate 46 and these heat dissipating columns 53 may be in contact with the lower face of the lower jig plate. Thereby, the heat dissipation at the center area of the lower jig plate 46 can be facilitated through the heat dissipating columns 53, and the temperature at the center area of the lower jig plate 46 can be lowered. As a result, the temperature difference of the lower jig plate 46 at the center area and the outer periphery portion of the lower jig plate 46 can be balanced, and the temperature difference of the lower jig plate 46 at each position can be even out.

As discussed in above, the substrate processing apparatus 10 according to the present embodiment includes the columnar members 50 supporting the lower jig plate 46 as shown in FIG. 8. By applying pressure to the substrate 2 arranged on the lower jig plate 46 while the columnar members 50 are supporting the lower jig plate 46, the in-plane distribution of bending generated to the lower jig plate 46 can be adjusted depending on the shapes, materials, or arrangements of the columnar members 50, thereby the in-plane distribution of load applied to the substrate 2 can be adjusted to be uniform.

Also, in the present embodiment, by contacting the heat dissipating columns 53 to the lower face of the lower jig plate 46 at the position where no columnar members 50 are arranged or relatively few columnar members 50 are arranged, heat of the lower jig plate 46 can be released through the heat dissipating columns 53 without affecting the support force provided from the columnar members 50 to the lower jig plate 46. Thereby, the temperature difference of the lower jig plate 46 is barely generated across the position where the columnar members 50 are arranged and the position the columnar members 50 are not arranged (also across the position where relatively more columnar members 50 are arranged and the position where relatively fewer columnar members 50 are arranged). Hence, it is unlikely to have surface accuracy fluctuation depending on the position of the lower jig plate 46 which is caused by heat deformation of the lower jig plate 46. Therefore, uniform load can be applied to the substrate 2 arranged on the lower jig plate 46.

Also, the present embodiment includes the installation portion 52 where the columnar members 50 and the heat dissipating columns 53 are installed. Therefore, the positions of the columnar members 50 can be determined easily, the position shifting of the columnar members 50 can be prevented, and the columnar members 50 can stably support the lower jig plate 46. Also, the positions of the heat dissipating columns 53 can be determined easily, the position shifting of the heat dissipating columns 53 can be prevented, and the heat dissipating columns 53 can stably support the lower jig plate 46.

Note that, the present disclosure is not limited to the above-described embodiments, and various modifications can be made within the scope of the present disclosure.

In the above embodiments, all of the columnar members 50 were a circular columnar shape. However, one of the columnar members 50 may be a circular columnar shape, and other columnar members may be a polygonal columnar shape, a conical shape, a polygonal pyramid shape, or the like. The columnar members 50 having such shapes have different strain amounts when a certain load is applied. Therefore, also in this case, similar to the above embodiments, the support member 45 can adjust the in-plane distribution of load applied to the lower jig plate 46 and adjust bending generated to the lower jig plate 46 by the stain amount differences based on the difference in the shapes of the columnar members 50.

In the above embodiment, the support member 45 may provide a support force to the lower jig plate 46 in accordance with the distribution of height of the substrate 2 on which the elements 4a, 4b, and 4c are arranged. The non-uniformity of load applied to the substrate 2 may be caused by the distribution of height of the substrate 2. The distribution of height of the substrate 2 may be caused by differences in shapes or sizes of the elements 4a, 4b, and 4c, asymmetrical arrangement of the elements 4a, 4b, and 4c with respect to the substrate 2, deformation of the elements 4a, 4b, and 4c during pressurization, or the like. For example, if no measures are taken, a relatively small load may be applied at a position where the height of the substrate 2 is relatively low, and a relatively large load may be applied at a position where the height of the substrate 2 is relatively high (the opposite pattern may also occur).

Even in such a case, at a position where the height of the substrate 2 is relatively low, by arranging columnar members which do not strain easily, a relatively large supporting force is provided by the supporting member 45 (the columnar members 50) to the lower jig plate 46 so that the load applied to the lower jig plate 46 increases; and at a position where the height of the substrate 2 is relatively high, by arranging columnar members 50 which easily strain, a relatively small supporting force is provided by the supporting member 45 (the columnar members 50) to the lower jig plate 46 so that load applied to the lower jig plate 46 decreases, thereby the load applied to each position of the lower jig plate 46 can be balanced out and a uniform load can be applied to the substrate 2.

Figure 2:
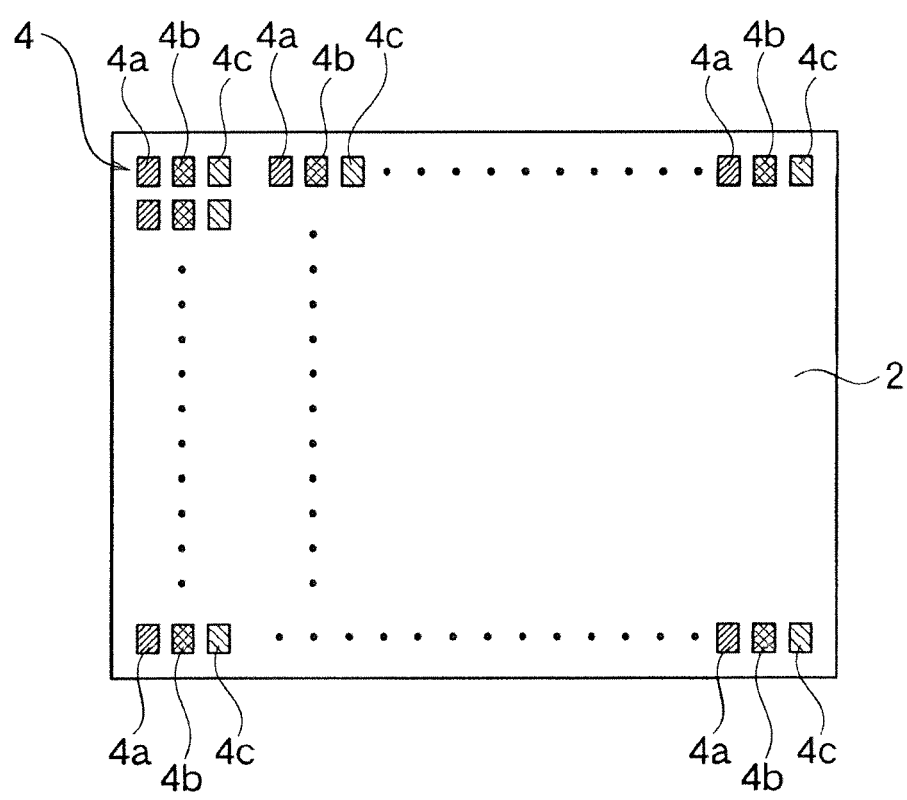
FIG. 2 is a diagram showing a substrate which is an object to be pressurized of the substrate processing apparatus shown in FIG. 1A.
Figure 2:
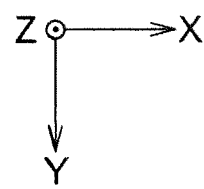

In the above embodiments, as shown in FIG. 2, the shape of the substrate 2 is a quadrangular shape, but it may be circular or other polygonal shapes.

In the above embodiments, the heat dissipating columns 53 are directly in contact with the lower face of the lower jig plate 46, however, the heat dissipating columns 53 may be in contact with the lower face of the lower jig plate 46 indirectly. Even in such case, the same effects as the above-mentioned embodiments can be attained.

In the present embodiment, as shown in FIG. 8, the heat dissipating columns 53 are in contact with the lower jig plate 46, however, single heat dissipating column 53 may be in contact with the lower jig plate 46.

The configuration shown in FIG. 9, is one example, and it may be modified accordingly. For example, at least part of the columnar members 50b and 50c positioned at the outer periphery portion of the installation portion 52 shown in FIG. 4 may be formed using a member with high thermal conductivity, thereby the thermal conductivity of the columnar members 50b and 50c may be made higher compared to the columnar member 50a positioned at the center area of the installation portion. Thereby, the columnar members 50b and 50c may function as the heat dissipating columns 53, and heat dissipation at the outer periphery portion of the lower jig plate 46 may be facilitated using the columnar members 50b and 50c.

Alternatively, the columnar members 50 (such as the columnar members 50b and 50c and so on shown in FIG. 4) supporting the outer periphery portion of the lower jig plate 46 may include the cover portion 531 and the resilient portion 532 shown in FIG. 9, thereby said columnar members 50 may function as the heat dissipating columns 53. In this case, in order to avoid an excessively large force to be provided to the lower jig plate 46 from the columnar members 50, the length of the columnar member 50, the resilient force of the resilient portion 532, and the like is preferably adjusted accordingly.

DESCRIPTION OF THE REFERENCE NUMERICAL

2 . . . Substrate
4 . . . Element Array
4a, 4b, 4c . . . Elements
6 . . . Pressure sensitive paper
10 . . . Substrate processing apparatus
21 . . . Pedestal
21 . . . Pedestal upper portion
22 . . . Movable Pressurizing portion
220 . . . Through hole
221 . . . Center area
23 . . . Pedestal lower portion
24 . . . Guide Bush 25 ... Guide shaft
30 ... Load Generating portion
40 ... Substrate Pressurizing portion
41 ... Upper stage
42 ... Lower stage
43 ... Upper mounting portion
44 ... Upper jig plate
45 ... Support member
46 ... Lower jig plate
460 ... Central area
461 ... Side area
462 ... Joining depression
50a to 50g ... Columnar members
500 ... Collective body
501 ... Installation hole
52 ... Installation portion
520 ... Center Area
521 ... Joining depression
522 ... Installation hole
53 ... Heat dissipating column
530 ... Column main body
530a ... Top portion
530b ... Side portion
531 ... Cover portion
531a ... Upper face
531b ... Opening edge
532 ... Resilient portion
531 ... First space
534 ... Second space
535 ... Joining depression
54,55 ... Joining member

What is claimed is:

1. A substrate processing apparatus comprising
a lower jig plate for arranging an object to be pressurized,
columnar members supporting the lower jig plate, and
a heat dissipating column contacting the lower jig plate directly or indirectly and having a higher heat dissipation property than the columnar members, wherein
the heat dissipating column includes
a column main body, and
a cover portion covering the column main body and comprising a material with a higher thermal conductivity than the column main body.

2. The substrate processing apparatus according to claim 1, wherein
the heat dissipating column includes heat dissipating columns, and
the heat dissipating columns are arranged in accordance with an in-plane distribution of temperature of the lower jig plate.

3. The substrate processing apparatus according to claim 1, wherein the cover portion is attached at a top of the column main body, and a resilient member is provided between the cover portion and the top of the column main body.

4. The substrate processing apparatus according to claim 1, wherein the heat dissipating column is provided at a position where a large load is applied to the lower jig plate.

5. The substrate processing apparatus according to claim 1 further comprising an installation portion where the columnar members and the heat dissipating column are installed.

* * * * *